United States Patent [19]
Rhodes

[11] Patent Number: 5,557,559
[45] Date of Patent: *Sep. 17, 1996

[54] UNIVERSAL BURN-IN DRIVER SYSTEM AND METHOD THEREFOR

[75] Inventor: James V. Rhodes, Chandler, Ariz.

[73] Assignee: Motay Electronics, Inc., Chandler, Ariz.

[*] Notice: The term of this patent shall not extend beyond the expiration date of Pat. No. 5,390,129.

[21] Appl. No.: 173,618

[22] Filed: Dec. 23, 1993

Related U.S. Application Data

[63] Continuation-in-part of Ser. No. 908,968, Jul. 6, 1992, Pat. No. 5,390,129.

[51] Int. Cl.$^6$ .................................................... G06F 19/00
[52] U.S. Cl. ...................... 364/580; 364/480; 364/579; 324/765; 395/161
[58] Field of Search ............................ 364/579, 580, 364/480; 371/22.1; 395/575, 155, 156, 161; 324/158.1, 765, 555, 760

[56] References Cited

U.S. PATENT DOCUMENTS

| | | | |
|---|---|---|---|
| 4,055,801 | 10/1977 | Pike et al. | 364/550 |
| 4,807,161 | 2/1989 | Comfort et al. | 364/550 |
| 4,866,714 | 9/1989 | Adams et al. | 371/22.1 |
| 4,868,785 | 9/1989 | Jordan et al. | 395/140 |
| 5,001,714 | 3/1991 | Stark et al. | 364/580 |
| 5,325,309 | 6/1994 | Halaviati et al. | 364/489 |
| 5,371,851 | 12/1994 | Pieper et al. | 395/164 |

Primary Examiner—Emanuel T. Voeltz
Assistant Examiner—Kyle J. Choi
Attorney, Agent, or Firm—Harry M. Weiss; Jeffrey D. Moy; Harry M. Weiss & Associates, Inc.

[57] ABSTRACT

In association with a burn-in system for the accelerated life testing of semiconductor devices, of the type including a burn-in driver universally reconfigurable by computer control, a computer software system and method combining interactive systems for designing projects having data for reconfiguring the driver, designing test sequences having data for controlling semiconductor burn-in, designing oven chamber and driver and burn-in board configurations for use in burn-in control, controlling burn-in testing, diagnosing hardware problems, and providing system security. The software system of a multi-purpose computer controlled driver system functions with and controls the burn-in system hardware to accomplish the signal conditioning and testing during the same time period of a wide variety of devices quickly and efficiently with a minimum of system setups and change-overs.

60 Claims, 36 Drawing Sheets

Decimal  
Binary
Decimal
Hexadecimal
Octal

UNIVERSAL BURN-IN DRIVER SYSTEM AND METHOD THEREFOR

BACKGROUND OF THE INVENTION

Related Application and Microfiche Filing of Source Code:

This patent application is a continuation-in-part of my earlier patent application entitled "Universal Burn-in Driver System and Method Therefor", Ser. No. 07/908,968, filed Jul. 6, 1992 now U.S. Pat. No. 5,390,129, and is incorporated by reference thereto. Also filed in microfiche in connection herewith and incorporated by reference hereby is a printout of the source code of a described preferred embodiment of the software system of the present invention.

Field of the Invention

This invention relates generally to testing of electronic components and more specifically to an improved system and method for the accelerated life testing of semiconductor devices in which the software system of a multi-purpose computer controlled driver system can function with and control the system hardware to accomplish the signal conditioning and testing of a wide variety of devices quickly and efficiently with a minimum of system setups and changeovers.

Description of the Prior Art

Accelerated life testing of semiconductor devices is a process which electrically ages these devices in their final and packaged form to help find defects which would result in premature failure. Although a variety of electrical conditioning and testing procedures may be used, most processes use heat as an accelerator by applying temperature stress to bring a defective semiconductor device to its failure point more quickly. Because of this use of heat, the commonly used term to describe such procedures is "burn-in" and the associated equipments are called burn-in systems. The required heat may be externally generated by placing the semiconductor devices in an oven, or by placing a heat source physically in contact with the semiconductor device package. The heat may also be self generated by electrically conditioning (biasing) the device to an extreme electrical condition.

Burn-in procedures were originally developed to prove that semiconductor devices would not fail early on in their operating life cycle. A key factor in their use to improve the reliability of semiconductor devices was the statistical analyses of the operating life of a given type device. These analyses usually showed a higher rate of failure during an initial "infant mortality" phase of operating life, a greatly reduced and stable rate of failure during the "normal operation" phase of operating life and, finally, typically after many years of operation, a gradually increasing rate of failure during the final "wear-out" phase of operating life. A further key factor was the statistical finding that "infant mortality" type failures could be caused to occur more quickly ("accelerated") through the use of heat and electrical over-stress. Thus failures of defective devices which might take months or years to occur under normal conditions could be caused to occur in just a few hours under burn-in conditions while non-defective devices were unaffected.

During the initial phases of the development of semiconductor devices, burn-in was widely used on products which had stringent reliability requirements to empirically demonstrate that the devices had survived the infant mortality phase of operation and were therefore reliable. Thus most semiconductor manufacturers have integrated burn-in into many of their intermediate manufacturing processes as well as a final test before shipment to a customer. As knowledge about the root causes of semiconductor device failure has increased and as the nature of the semiconductor manufacturing process has evolved to eliminate these root causes, the overall reliability of semiconductor devices has greatly improved. This improvement in reliability has occurred in a wide range of semiconductor devices including analog or linear devices and digital logic, memory or microprocessor devices and has resulted in changes in the way in which semiconductor manufacturers make use of their burn-in facilities. Instead of empirically confirming reliability by "burning-in" large quantities of the same device, manufacturers are using burn-in facilities to generate characterization and failure mode data on a wider variety of devices. By carefully controlling and recording the conditions which ultimately result in device failure and by performing thorough postmortem analyses to establish the precise root cause of each device failure, a statistical database can be created which allows continuing improvement in the design factors and the semiconductor processing steps used to make each device. These improvements in turn lead to still greater improvements in the overall quality and reliability in the semiconductor devices which have been analyzed and qualified through the burn-in process.

Developing a dynamic burn-in strategy is an important part of device design. Thinking in terms of a burn-in strategy becomes more important as the device package shrinks in size and the overall complexity of the product grows. By finding the infant mortality point early, the product quality is improved and the cost to reliably manufacture the product is reduced. The design of the device under test (DUT) is an important part of new product development for two main reasons. First, the company should consider the overall cost of the burn-in process for the particular product. Companies today may develop a different burn-in driver for each new DUT, or even for various renditions of the same DUT. This is a costly process. In addition, an established burn-in process is necessary to find flaws in the design before the product can enter the production stage. A burn-in driver that can handle any type of DUT, combined with user-friendly software capable of configuring the hardware to any particular device, minimizes the time and cost burden associated with the burn-in development.

There are three phases of DUT design. In the product design phase, the company develops and designs a new component. In the product reliability phase, the company performs a set of preliminary tests, including a reliability burn-in test, on the DUT to ensure that the product can be manufactured with the highest possible reliability. (The reliability burn-in is a fully functional set of tests that a company uses to find errors due to design defects, usually very rigorous.) The product manufacture phase is the stage where the DUT is physically built and tested for manufacturing defects. There are many steps involved with the product manufacture phase: production manufacture, i.e., the actual manufacturing of the component; prescreen production test, a set of tests designed to ensure that the individual parts of the DUT are functioning within specified parameters before burn-in; production burn-in, a stressed and accelerated set of tests to discover defects due to manufacturing defects; and production Test, a set of fully functional tests to verify 100% DUT operation before shipment to the customer. Every electronics company uses essentially the same hardware components and test profiles to run both the production and reliability burn-in processes to test new DUTs. Each component is separate from the other. Every new or revised DUT requires totally new hardware, or at the very least, the existing hardware needs re-programmed or re-wired.

Following is a list of the components involved with both production and reliability burn-in process followed by a short definition: Burn-in biases—An electrical schematic as seen by the DUT on a BIB. Burn-in drivers—A signal generator that provides an electrical stimulus to the BIB. Burn-in boards (BIB)—A physical entity that provides a mechanical and electrical means of placing semiconductors into a burn-in chamber. Burn-in stresses and vectors—Test patterns and electrical signals provided to the DUT via the burn-in driver. Burn-in programs—A profile of time, temperature and stress change provided during burn-in.

One of the main problems that electronics companies face is that many of the burn-in procedures are performed manually. Such functions include monitoring and recording the test signals to and from each DUT, designing and building new drivers for each DUT, separating drivers for each test, and re-programming or re-wiring drivers.

Old burn-in processing methods contain essentially the same types of procedures, most of which was done by hand. An engineer designed an electrical schematic, or bias diagram, that was replicated and forms the BIB. The driver to test each new product was designed, or re-wired, a lengthy process. During the manufacturing of the driver, a set of patterns and burn-in profiles was developed and used to test the DUT. The bias diagram, test patterns and burn-in profiles was programmed into the driver and placed in the chamber. The burn-in procedure was performed. Every setting used in the burn-in process, i.e., voltages, frequencies, temperature, how long the burn-in is performed and other testing parameters, had to be designed into the hardware using manual method. If the user decided to change the product or the settings, the user had to manually make the change at the hardware level or create an entire new system. The entire process to develop a burn-in strategy for a single product could feasibly take six months to a year to perform.

Applicant's parent application has described a burn-in system which uses modular system elements which are readily reconfigured by computer control to efficiently meet the burn-in requirements for a wide variety of devices with a minimum of hardware reconfiguration. In order to take full advantage of the power, speed and efficiency which is possible with computer control, the burn-in system of the present invention must include modular and interactive software which assists the user in independently defining and modifying parameters and in designing and applying the complex series of test sequences which are required to properly exercise and validate the operation of a complex modern semiconductor device. For example, comprehensive and effective burn-in sequences for state-of-the-art microprocessor devices require clock and input-output sequences which exercise all of the internal functions of the microprocessor in all of the possible ways in which they might interact. It would be extremely difficult and time-consuming to design or modify such a burn-in sequence without the power of modular and interactive software.

As a result of the above described increasing and crucial role of burn-in in the manufacture of reliable semiconductor devices, there exists a need for more sophisticated burn-in systems having modular system elements reconfigured by computer control in which the software which defines and controls the system is effectively modular and user-interactive and "friendly" towards the user, thereby allowing the user to accomplish the design, modification, and documentation of desired burn-in sequences and facilitate data collection and analysis for a wide variety of devices in a manner which is efficient and cost effective.

Burn-in equipment usually consists of three major physical components for testing a Device Under Test (DUT). A burn-in driver is an electronic device that provides the input, or stimulus, and monitors the output, to the DUT. A burn-in board (BIB) is a piece of hardware that provides both mechanical and electrical means of placing semiconductors in a burn-in chamber. A burn-in chamber is a physical enclosure that creates the burn-in environment. The chamber contains both the driver and BIB and may provide a harsh environment for the DUT. The burn-in driver generates complex electrical signals, called vectors. Vectors are then placed in a group called a pattern. In a typical burn-in system, the patterns provide signals that toggle the internal circuitry of the DUT, which exercise the internal transistors of the DUT. The burn-in cycle is a combination of generated vectors, a temperature profile and the allotted time period.

In most cases today, each original product introduced by semiconductor companies requires the design and manufacture of an entirely new set of BIBs and drivers. This is an extremely expensive and time-consuming process. The driver's overall design is usually for a specific and limited use, generally for one or a product line, of semiconductor products. If the burn-in driver designer used good planning, and anticipated potential new product features, some drivers might only require re-programming and simple re-wiring before use on other products. However, this is still a timely and costly process. One can see there must be a more dynamic, time-saving, cost productive method of developing burn-in drivers for new products.

OBJECTS OF THE INVENTION

Accordingly, it is an object of this invention to provide an improved system and method for the accelerated life testing of semiconductor devices.

It is a further object of this invention to provide an improved system and method for the accelerated life testing of semiconductor devices which uses a multi-purpose computer controlled driver system.

It is a further object of this invention to provide an improved system and method for the accelerated life testing of semiconductor devices which uses a multi-purpose computer controlled driver system to accomplish the signal conditioning and testing of a multiplicity of semiconductor devices including analog or linear devices and digital logic, memory or microprocessor devices.

It is a further object of this invention to provide an improved system and method for the accelerated life testing of semiconductor devices which uses a multi-purpose computer controlled driver system to accomplish the signal conditioning and testing of a multiplicity of semiconductor devices, even during the same time period, and which uses a graphically based user-interactive software operating system to accomplish the design and documentation of the test sequences require for this testing quickly and efficiently in a manner which is Simple and easy for the system operator.

SUMMARY OF THE INVENTION

According to the foregoing objectives, this invention describes an improved driver system and method therefor for the accelerated life testing of semiconductor devices in which a menu based, graphically enhanced, user-interactive software operating system establishes multiple purpose computer control to accomplish the efficient signal conditioning, testing and data collection for a wide variety of semiconductor devices, even during the same time period, with a minimum of system setups and change-overs.

Further, this invention provides, in association with a burn-in system of the type including burn-in driver means universally reconfigurable by computer control, a computer system comprising, in combination, first computer editing means for independently setting as vector data vector parameters for testing a semiconductor device, and computer data storage means for storing such vector data as an identified project file. This first computer editing means includes display means for graphic representation of test waveforms for multiple channels, and wherein such vector data is storable in such computer data storage means in form for use to configure such burn-in driver means.

The computer system of this invention also provides second computer editing means for independently setting as sequence data sequential parameters for controlling the testing of semiconductor devices, and computer data storage means for storing such sequence data as an identified sequence file. This second computer editing means includes command means for including as one of such sequential parameters a such project file, and wherein such sequence data is storable in such computer data storage means in form for use to control such burn-in driver means. This computer system also provides third computer editing means for graphically setting as burn-in system data a burn-in system configuration for controlling the testing of semiconductor devices, and computer data storage means for storing such burn-in system data as an identified burn-in system file.

In addition, the computer system of this invention includes computer burn-in control means for controlling such burn-in system, and wherein such computer burn-in control means includes command means for including such burn-in system file, and wherein such computer burn-in control means includes command means for including a such sequence file for use to control such burn-in driver means. Such computer burn-in control means includes reactive means for mid-test amendment of sequence parameters in response to computer receipt of selected test data concerning such semiconductor device from such driver means. The system of this invention also includes computer diagnostic means for testing such burn-in system, and wherein such computer diagnostic means includes command means for using a such project file to reconfigure such driver means. Additionally, the present computer system contains a data port and includes computer security means for restricting access to such computer system, said security means including the requirement for access of the presence of a pluggable key in such data port of such computer system. The present computer system also provides menu-based, interactive, graphic displays for such first, second, and third computer editing means.

The present invention also provides a method for computer control of a burn-in system of the type including burn-in driver means universally reconfigurable by computer control. One preferred method comprises the steps of independently computer-setting as vector data vector parameters for testing a semiconductor device, and computer-storing such vector data as an identified project file. A further step is computer-displaying graphic representation of test waveforms for multiple channels during such computer-setting of said vector parameters. Another step is storing such vector data in such computer data storage means in form for use to configure such burn-in driver means.

The method for computer control also comprises the steps of independently computer-setting as sequence data sequential parameters for controlling the testing of semiconductor devices, and computer-storing such sequence data as an identified sequence file. Further steps are including as at least one of such sequential parameters a such project file, and storing such sequence data in such computer data storage means in form for use to control such burn-in driver means. The method of this invention for computer control further comprises the steps of graphically computer-setting as burn-in system data a burn-in system configuration for controlling the testing of semiconductor devices, and computer-storing such burn-in system data as an identified burn-in system file. Further, this method comprises the step of computer-controlling such burn-in system. It further comprises the step of including one such burn-in system file in such computer-controlling. And it comprises the step of including one such sequence file in such computer-controlling. The present method further comprises the step of mid-test amending of sequence parameters in response to computer receipt of selected test data concerning such semiconductor device from such driver means.

Also, the method of the present invention comprises the step of computer-testing such burn-in system, including the step of using a such project file to reconfigure such driver means. And it further comprises the steps of including a data port in such computer system, and restricting access to such computer system by security means, such security means including the requirement for access of the presence of a pluggable key in such data port of such computer system.

DETAILED DESCRIPTION

Figure 1:
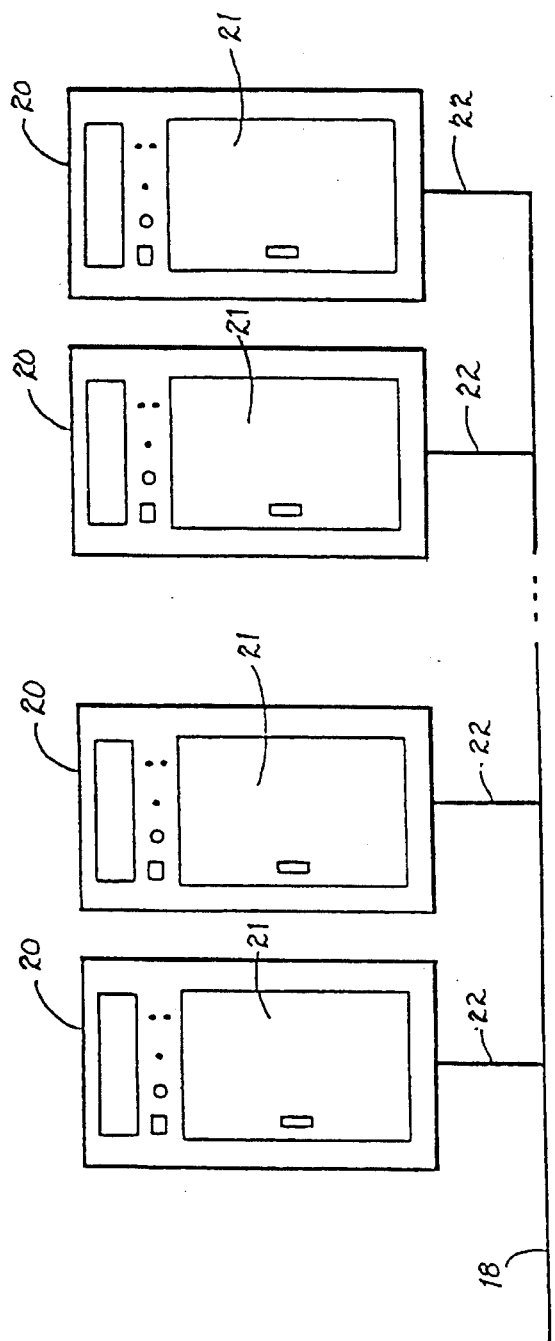
FIG. 1 is a pictorial block diagram of a computer controlled burn-in system having operating system software according to the present invention.
Figure 1:
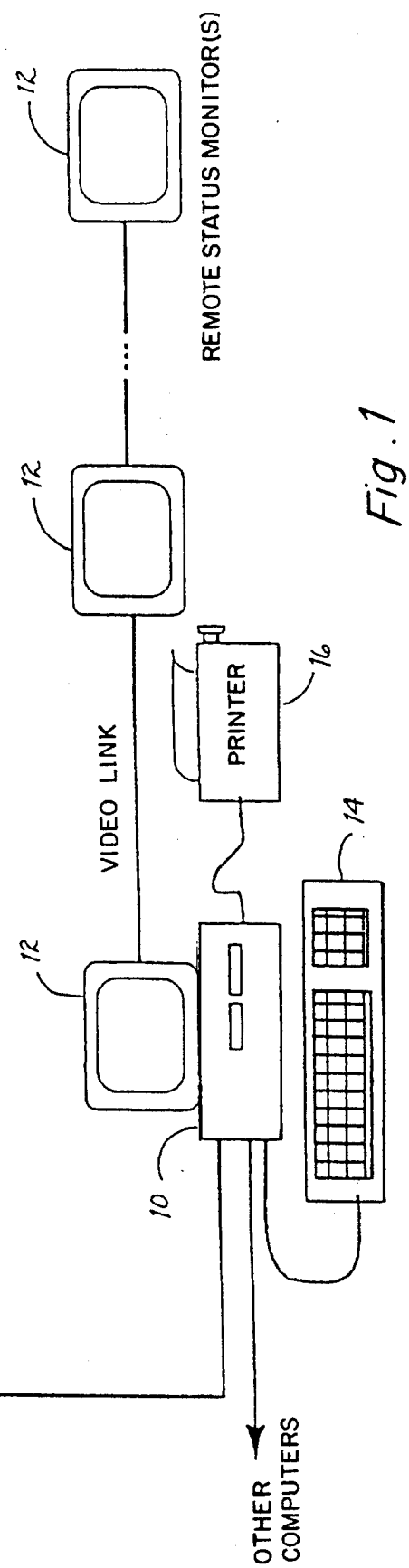

FIG. 1 shows a pictorial block diagram of a computer-controlled burn-in system which incorporates a universal driver system and which is controlled by operating software of the present invention. The system of FIG. 1 has been described in detail in the parent application and is included herein for convenience. In this system, the previously described main computer 10 having a monitor 12, input keyboard 14, and printer 16 form the central control element for the system thereby forming the vehicle for executing the operating software of the present invention. This software provides the required capabilities to develop the control sequences required by the system, to translate the control sequences into executable files of operational commands which are acted upon by the previously described hardware modules of the universal driver system and, to respond to and record the interrupt and data log requests generated by the system during the "burn-in" processes which have been previously defined and described in the parent application. As shown in FIG. 1, a data bus 18 forms an input-output data link to a multiplicity of burn-in ovens 20 with each oven having a data port 22 which provides two-way access to data bus 18. Each of the burn-in ovens 20 is an environmental testing chamber adapted to contain a number of circuit boards (commonly called "burn-in boards") each of which can house a number of electronic devices such as integrated circuits. The interior of burn-in oven 20 is accessed through door 21. Each burn-in oven has its own monitoring display 24 and manual and automatic controls 26. Associated with each of the burn-in ovens 20 but not shown are a multiplicity of the universal driver modules which have been described in detail in the parent application.

Figure 2:
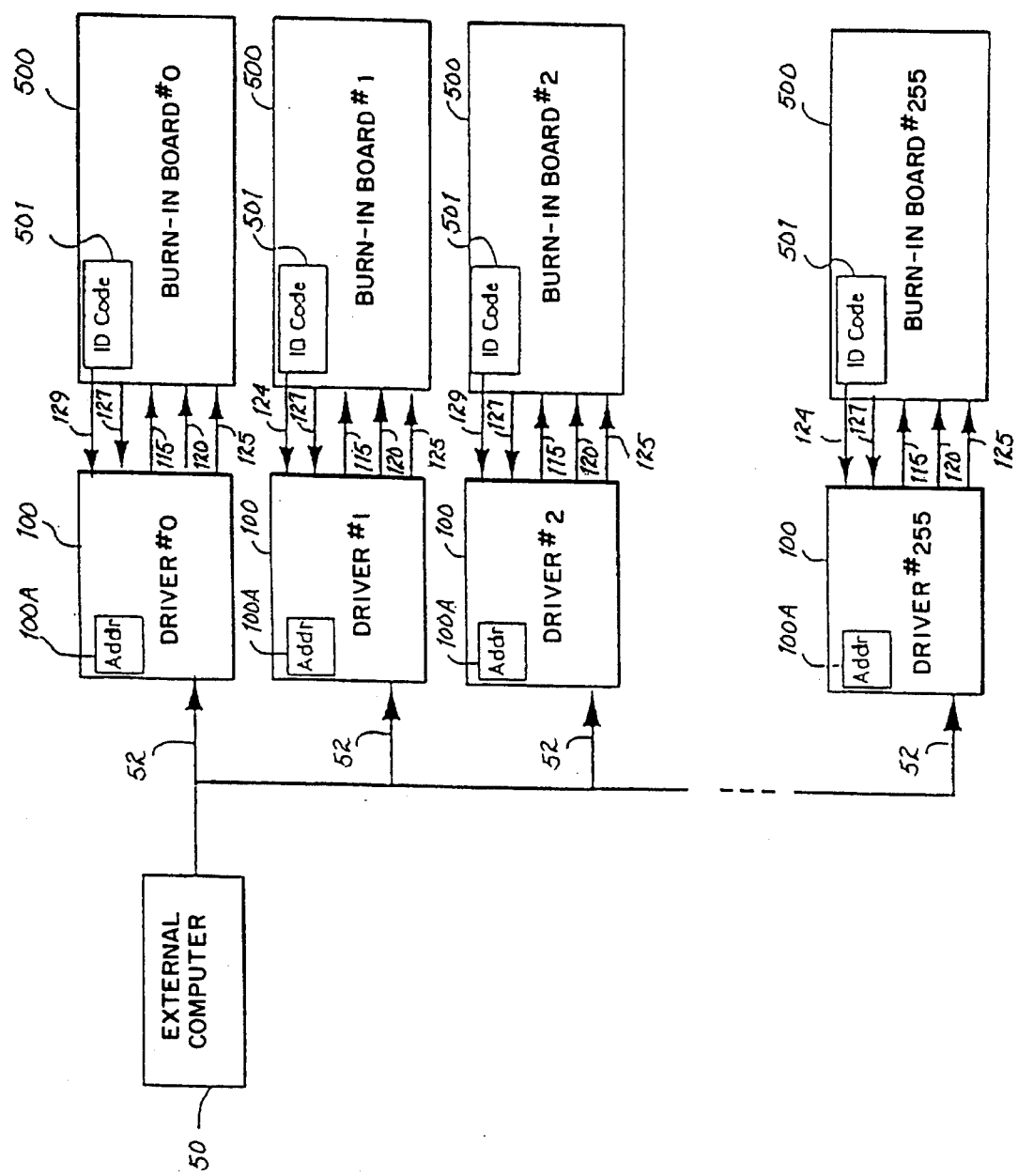
FIG. 2 is a simplified block diagram of a computer controlled burn-in system having universal driver circuits controlled by operating system software according to the present invention.

FIG. 2 is a simplified block diagram of a computer-controlled burn-in system which incorporates a universal driver system and which is controlled by operating software of the present invention. FIG. 2 has also been described in detail in the parent application and is included herein for convenience. In FIG. 2, an external computer 50 is coupled to a plurality of universal driver systems 100 via computer bus 52. Each of the universal driver systems 100 is coupled to a burn-in board 500 by a plurality of input and output signal paths which provide the required digital and analog signals to properly control, exercise and monitor the devices under test (DUT's) that are mounted on each burn-in board as has been previously described in the parent application. Output signal paths which couple from each of the universal driver systems 100 to a burn-in board 500 include power bus 115, analog bus 120 and vector/monitor bus 125. Input signal paths which couple from each burn-in board 500 to a universal driver system 100 include DUT monitors bus 127 and automatic programming bus 129. Each burn-in board 500 also includes an identification code means 501 which couples to the associated driver system 100 via automatic programming bus 129. Identification code means 501 allows each burn-in board 500 to be uniquely identified by the operating software of the present invention which is resident and functioning in external computer 50 so that particular sets of stored instructions, and data can be loaded into a particular driver system 100. These sets of stored instructions and data cause the reconfiguring of the electrical properties of the driver system 100 appropriate for the particular devices under test that are installed in the particular burn-in board 500 which is coupled to the driver system 100, as has been described in detail in the parent application. Thus the electrical properties of the driver system 100 can be changed by the control exercised by the operating system software of the present invention to meet the requirements of the particular devices under test that are installed in the particular burn-in board 500 which is coupled to the driver system 100 without any hardware change or reconfiguration as would be required for prior art driver systems.

Figure 3:
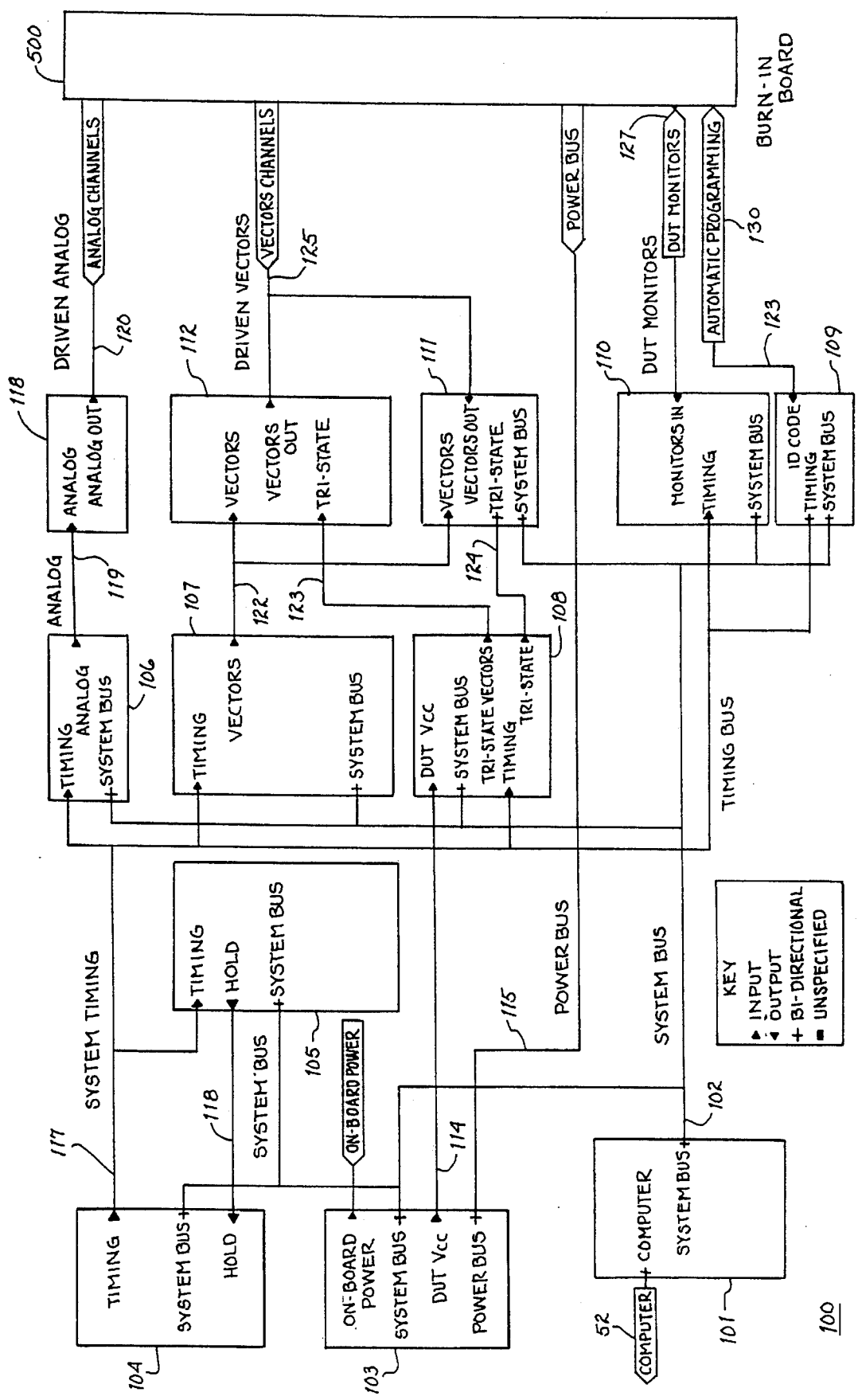
FIG. 3 is a generalized block diagram of the universal driver system of the present invention.

FIG. 3 is a generalized block diagram of the universal driver system 100 of the present invention and the primary controllable hardware device which is controlled by the computer system of the present invention to be particularly described herein. FIG. 3 also has been described in the parent application in more detail and is included herein for convenience. In FIG. 3, a computer bus 52 (a bi-directional bus) couples from an external computer 50 (see FIG. 2) to computer interface module 101. Computer interface module 101 contains address logic circuitry which determines that driver data present on computer bus 52 is received by the correct one of a plurality of the universal driver system 100. Computer interface module 101 also contains the transceiver and select logic circuitry required to provide direction and control for data being transferred from external computer 50 to the particular modules which comprise universal driver system 100 and, conversely, for data being transferred from the particular modules which comprise universal driver system 100 to external computer 50. Computer interface module 101 is coupled to all of the plurality of other modules which make up universal driver system 100 of the present invention by system bus 102 (a bi-directional bus). System bus 102 comprises a plurality of signal paths for transmitting and receiving the data and control signals required to control and reconfigure the other modules which make up universal driver system 100 of the present invention. Thus system bus 102 couples to power management module 103, system timing generation module 104, vector hold module 105, analog generation module 106, vector storage module 107, tri-state control module 108, automatic programming module 109, DUT monitoring module 110, and on-board status monitoring module 111.

Power management module 103 functions to measure and regulate the different voltages that are required by the individual modules that make up universal driver system 100 and by the particular burn-in board 500 with which it is associated. Power management module 103 is coupled to tri-state control module 108 by DUT Vcc "On" conductor 114 (an output conductor). Power management module 103 is also coupled to power bus 115 (a bi-directional bus) and onboard power bus 116 (a bi-directional bus). Power bus 115 provides regulated power to the particular burn-in board 500 which is associated with the universal driver system 100 of interest and is not used on the driver system 100 except to provide the point at which the driver system generates and monitors (measures) the voltage conditions existing on the burn in board. On-board power bus 116 provides regulated power to the various modules which make up the universal driver system 100 so that all digital and analog circuits which are part of universal driver system 100 receive their power and precision references from this bus.

System timing generation module 104 provides programmable master and data clock signals required by the individual modules which comprise universal driver system 100. System timing generation module 104 also provides static and dynamic address sequencing signals to the static random access memory (SRAM) which is part of universal driver system 100. The output of system timing generation module 104 is transmitted on system timing bus 117 (an output bus) which couples to vector hold module 105, analog generation module 106, vector storage module 107, tri-state control module 108, automatic programming module 109 and DUT monitoring module 110.

Vector hold module 105 functions to extend the time interval of stored data patterns so that longer data sequences required to exercise devices under test can be generated without requiring additional memory. The output of vector hold module 105 is produced on the hold signal path 118 (an output path) which couples to system timing generation module 104 which then imposes hold requirements via system timing bus 117. Analog generation module 106 uses digital-to-analog converter (DAC) circuitry to generate a range of analog signals such as sine waves, square waves, ramp waves, and the like based on programmed patterns transmitted from external computer 50. The output of analog generation module 106 couples to analog driver module 113 via analog bus 119 (an output bus). Analog driver module 113 functions to provide additional current drive capability for the analog channels thereby allowing them to drive higher current loads. The output of analog driver module 113 couples to driven analog bus 120 (an output bus) which couples to the analog channels 121 which couple to the analog channel inputs of the burn-in board 500 (not shown) associated with this particular universal driver system 100.

Vector storage module 107 functions by using SRAM to provide the large digital storage area which retains the test data patterns ("vectors") which define the digital signals which will be applied to the devices under test (DUT's) which are housed in the burn-in board 500 associated with a particular universal driver system 100. The output of vector storage module 107 couples to vectors bus 122 (an output bus) which in turn couples to on-board status monitoring module 111 and to output driver module 112. Tri-state control module 108 functions to provide an additional dimension of output driver control by allowing a particular output driver to be switched to high-impedance or disconnected state in addition to the drivers normal ON (Current sourcing) and normal OFF (current sinking) states. This additional capability allows greater application flexibility for the driver by allowing it to be configured in many different ways. Tri-state control module 108 produces one set of outputs on tri-state vectors bus 123 (an output bus) which couples to output driver module 112. Tri-state control module 108 produces a second set of outputs on tri-state bus 124 (an output bus) which couples to output driver module 112.

Output driver module 112 functions to provide additional current drive capability to the DUT's housed on the associated burn-in board 500 (not shown). Output driver module 112 also functions to allow universal driver system 100 to change the high level voltage (Voh) that is being applied to the DUT's housed on the associated burn-in board 500 (not shown). Output driver module 112 produces a set of outputs on driven vector bus 125 which couples to on-board status monitoring module 111 and to vector channels 126 which couple to the vector channel inputs of the burn-in board 500 (not shown) associated with this particular universal driver system 100. On-board status monitoring module 111 functions to monitor for faults that may occur within the various module elements which comprise universal driver system 100. On-board status monitoring module 111 is coupled to vectors bus 122 (an input bus), to driven vector bus 125 (an input bus), to tri-state bus 124 (a bi-directional bus) and to system bus 102 (a bi-directional bus). DUT monitoring module 110 functions to provide information about the operating condition of DUT's on the associated burn-in board 500 (not shown) to the external computer which is controlling and altering the operation of a particular universal driver system 100. This information is obtained by comparing data received from the DUT's on the associated burn-in board 500 with expected data (stored in SRAM by the external computer). When this comparison shows a difference, the information is passed to external computer 50 for data logging. DUT monitoring module 110 also couples to system timing bus 117 (an input bus) and to system bus 102 (a bi-directional bus). Automatic programming module 109 functions to provide a serial to parallel interface which translates the identification code which uniquely identifies a particular burn-in board 500 (not shown) that is associated with a universal driver system 100 to the external computer 50 as has been previously discussed. The designation "automatic" refers to the fact that various different types of burn-in boards 500 can be loaded into a burn-in chamber and the universal driver systems 100 associated with each of them will "automatically" recognize the identification code which uniquely identifies the particular burn-in board 500 and will then pass this code to external computer 50 over system bus 152 and computer bus 52 so that universal driver system 100 can be appropriately reconfigured by program without the need for human intervention to make changes on the driver system itself. Automatic programming module 109 couples to ID code bus 129 (an input bus) which is in turn coupled to the automatic programming channels 130 from the associated burn-in board 500 (not shown). Automatic programming module 109 also couples to system timing bus 117 (an input bus) and to system bus 102 (a bi-directional bus).

Figure 4:
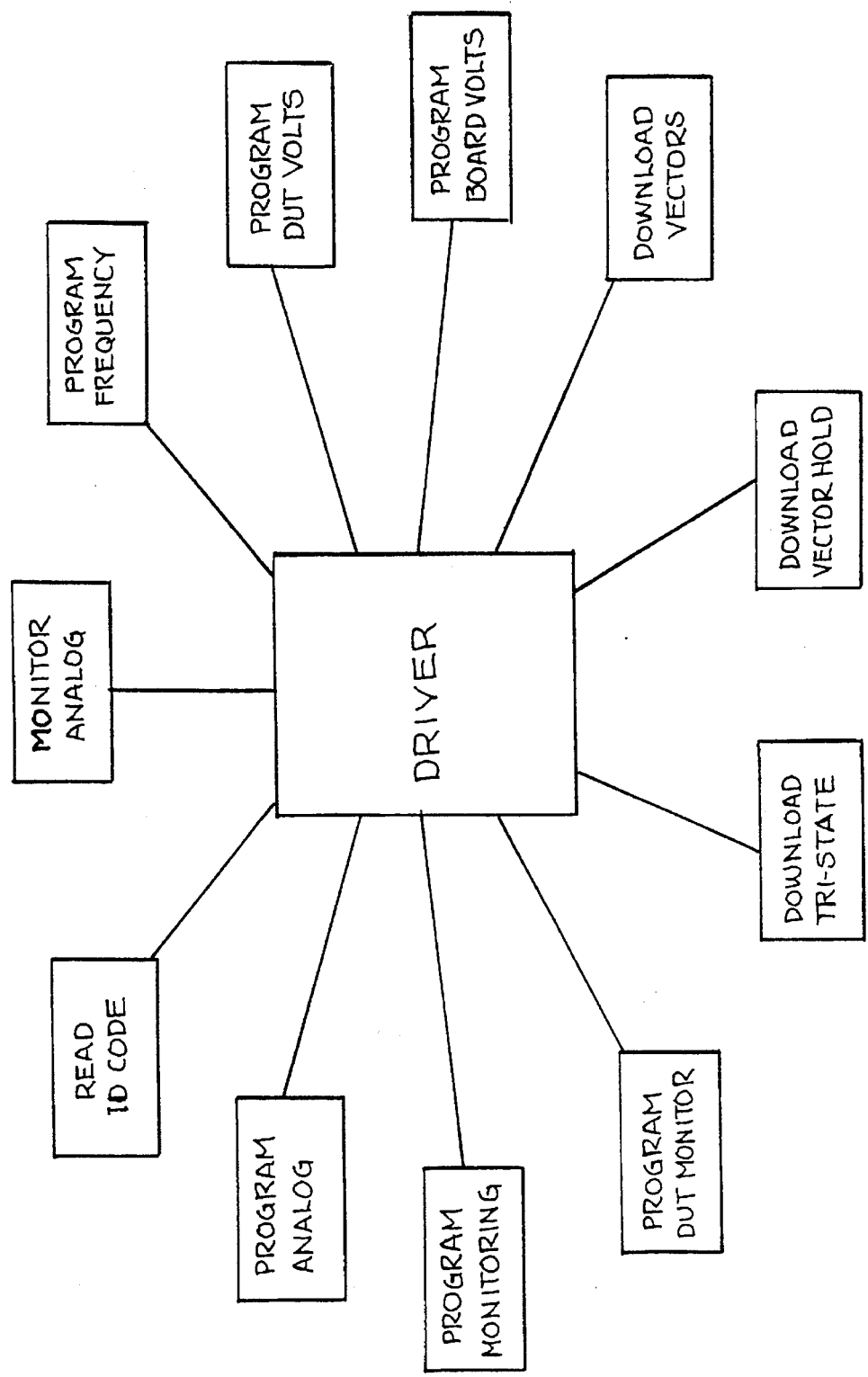
FIG. 4 is a functional relationship diagram summarizing the operating functions of the universal driver system of the present invention.

FIG. 4 is a functional relationship diagram summarizing the operating functions of the universal driver system of the present invention. Each of these functions has been described individually in terms of the operation of the constituent modules of the driver system already described herein and in the parent application. In terms of the overall operation, a burn-in sequence begins with the READ ID CODE block indicating the process by which the external computer identifies the particular burn-in board connected to a particular driver and correspondingly determines from its program the particular "project" that will be required for the devices known to be installed on the identified burn-in board. The execution of the computer program then causes the reconfiguration of the individual modules of the driver system as required. This reconfiguration includes the read-write sequences for PROGRAM ANALOG, PROGRAM MONITORING, PROGRAM DUT MONITOR, PROGRAM BOARD VOLTS, PROGRAM DUT VOLTS and PROGRAM FREQUENCY as dictated by the functional requirements of the individual driver modules previously described. These sequences can occur in any order and will be determined by the needs of an efficient programming sequence. Similarly, the execution of the computer program also causes storage of required vector and auxiliary control patterns in the SRAM modules of the driver system in accordance with the needs of the devices known to be installed on the identified burn-in board. This is accomplished via the read-write sequences for DOWNLOAD TRISTATES, DOWNLOAD VECTOR HOLD and DOWNLOAD VECTORS as dictated by the functional requirements of the individual driver modules previously described. These sequences can also occur in any order and will be determined by the needs of an efficient programming sequence. After the "project" has been completely loaded, the computer program initiates the actual burn-in sequence determined by the schedule of events. This schedule can be as simple or as complex as desired for the particular devices being tested and can include sequences with differing temperatures, voltages, clock frequencies, analog frequencies, etc., in whatever order and for whatever duration is desired. Additionally, sequences can be altered based on detected changes in the operating condition of devices under test through use of the MONITOR ANALOG function thereby creating a driver system which is highly versatile. This versatility is a key advantage of the present invention in that all of these changes in test condition can be accomplished quickly without removing the driver system from the burn-in environment and without making any mechanical changes. This feature bootstraps a still further advantage in that the existence of a single mechanical design allows this design to be optimized for high frequency operation so that devices under test can be operated at much higher internal clock rates so that overall burn-in cycles can be shortened.

As previously described in the parent application, these changes by software control can be accomplished remotely via external computer 50 without physical manipulation of the driver system 100 or of the associated burn-in board 500. These capabilities offer unique advantages over prior art driver systems because a single "universal" driver system can be used for a wide variety of different types of devices under test in a variety of test conditions, even during the same time period, by simply changing the set of software instructions which configure and control the driver system. The operating system software of the present invention makes further unique advances over prior art burn-in systems by using graphically-based, user-interactive techniques and simplification of the generation of complex test sequences to make it simple and efficient to edit existing sequences and create new sequences to meet the requirements of new devices and new test conditions as will be fully described herein.

As has been described in the parent application, a central concept in the operation of the universal driver system is the creation of a particular set of stored instructions and data called a "project" required to cause the reconfiguring of the electrical properties of the driver system 100 appropriate for the particular devices under test that are installed in the particular burn-in boards of the system. There are two important file types unique to the system of this invention. First, a project file is a complete collection of configuration and vector pattern information that is later downloaded to the driver 100. Two components comprise the project: a Pattern, a collection of signals and vectors at a given address channel; and Latched Settings or Static parameters, i.e., voltage and frequency, that are set only once for a particular driver. Second, a sequence file is a group of Events and Actions that duplicate or extend the burn-in driver board's capability by allowing quick re-configuration of the driver 100. The sequence allows the user to change DUT stresses based on time, temperature, or number of times that the test is run. The driver 100 of the present system can be re-programmed without direct human intervention. The sequence can be thought of as a burn-in cycle or plan. An Action is a single operation within a given Event for a specific driver 100. An Event is a group of Actions. The project file for a particular device comprises the complete collection of configuration and waveform pattern information which is subsequently downloaded to the driver 100 associated with that device. Each individual type of device to be burned-in requires the development of a project since items such as frequency, voltage settings and test patterns will change from device to device. The operating system software of the present invention groups all of the essential configuration data together and presents it to the system user in the form of a single element which is the project.

The system of this invention provides the electronic industry with a complete burn-in package that aids in the development of new product burn-in processes within a few hours. This capability leads to a lower cost and more controlled burn-in process. At the lowest level, the system focuses on two physical entities—the driver of the present invention and the software of the present invention. At higher levels, the system focus is on burn-in chambers and burn-in data network. With the system of this invention, the product focus moves from manufacturing new burn-in hardware to the development of the intricate burn-in cycle processes. Aided by graphically-based Windows@ software, the user's focus becomes directed to the DUT instead of the burn-in driver.

The present system uses two main software environments. The development tools constitute a collection of software packages that allows for the creation of two software file collections, called, again, the project (as further described in the parent application) and the sequence. The project and sequence are control files that allow for the programming of drivers 100 and maintaining the burn-in cycle, respectively. The production tools constitute a set of software packages that allows the user to run the drivers 100 with the project and sequence files on the actual burn-in system. Also, the system of the present invention automates data collection and storage using drivers 100 that test the DUTs during burn-in. The user has the ability to retrieve stored information for use through user-friendly, statistical analysis software. The user also has the ability to export the stored information for use in other software packages. These features create a sophisticated data management system. The following are some of the key capabilities which allow the system of this invention to become the solution to the burn-in problem: (1) One burn-in driver satisfies all signal generation needs; (2) High speed signal generation allows for burn-in at design specifications; (3) Automatic burn-in driver programming eliminates the need for operators to match BIBs and drivers; (4) No wasted chamber slots to maximize overall capacity; (5) Development of new burn-in products, achieved with user-friendly software, greatly reduces the high cost and manpower previously required; (6) Real time signal monitoring allows for the performance of reliability studies during burn-in; (7) A highly integrated and modular approach allows customized standard electronics and software modules; (8) The ability to use a wide variety of BIB types; (9) The determination of infant mortality curves within the first few burn-in lots; and (10) The data logging of errors to use in failure analysis.

Figure 5:
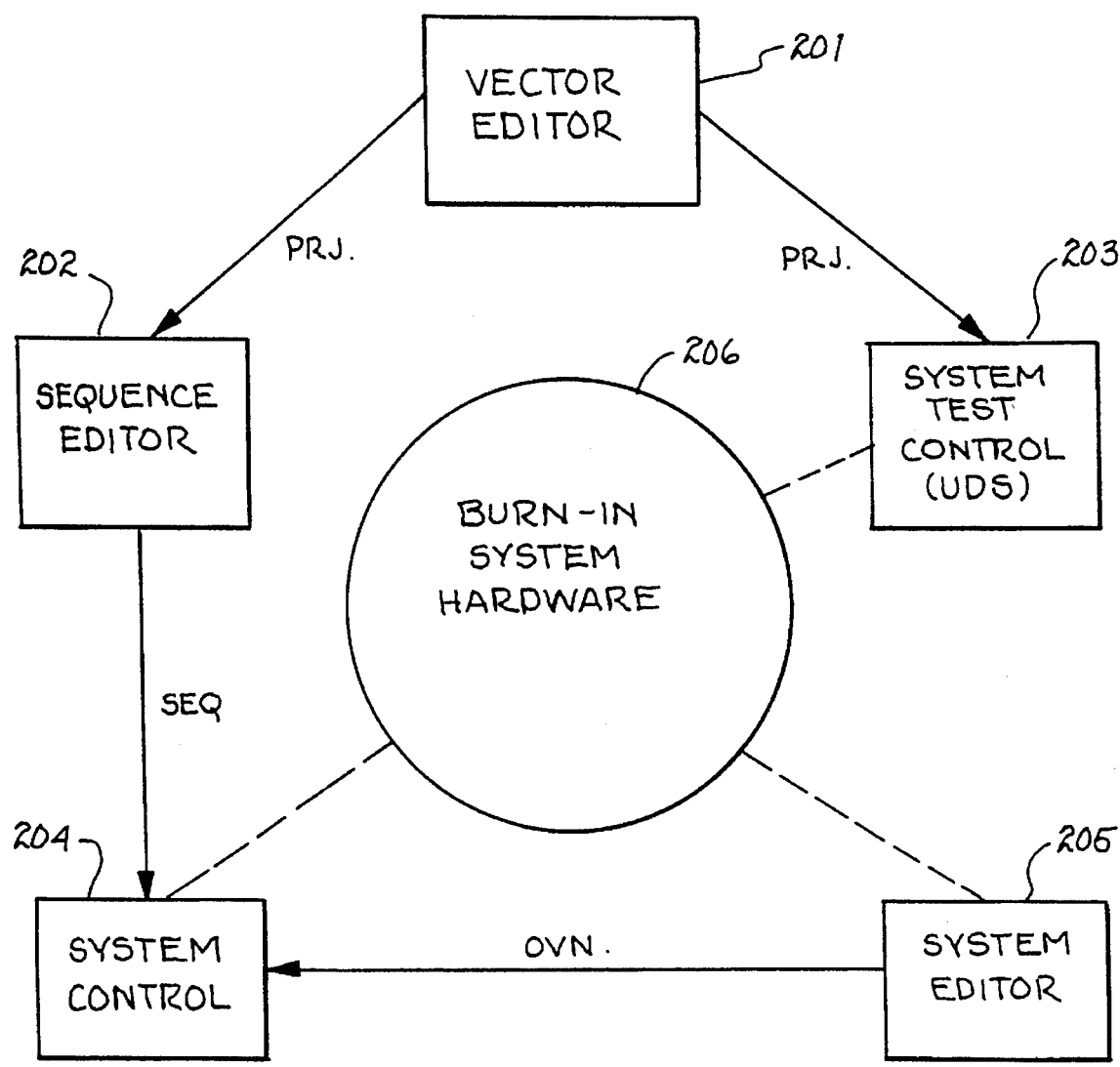
FIG. 5 is a simplified block diagram of a systems overview of the burn-in control computer applications of the present invention.

FIG. 5 is a system-overview diagram of the burn-in control computer applications (later described in detail) of the present invention. The waveform editor application 201 (also herein referred to as the vector editor or the project editor), wherein projects are designed and stored, transmits, when requested, a selected project file (denoted .prj) to the sequence editor application 202 and/or the system diagnostic application 203 (also herein called system test control or UDS application), a universal diagnostic system. The sequence editor, wherein sequences are designed and stored, transmits, when requested, a selected sequence file (denoted .seq) to the system control application 204 (also herein called the system controller). The system editor application 205, wherein burn-in system configurations are designed and stored, transmits, when requested, a selected system configuration file (denoted .ovn) to the system control application 204. As shown by dotted lines in FIG. 5, the system diagnostic application 203, the system control application 204, and the system editor application 205 all have connections with the generally denoted burn-in system hardware 206 as elsewhere herein and in the parent application described.

Figure 6:
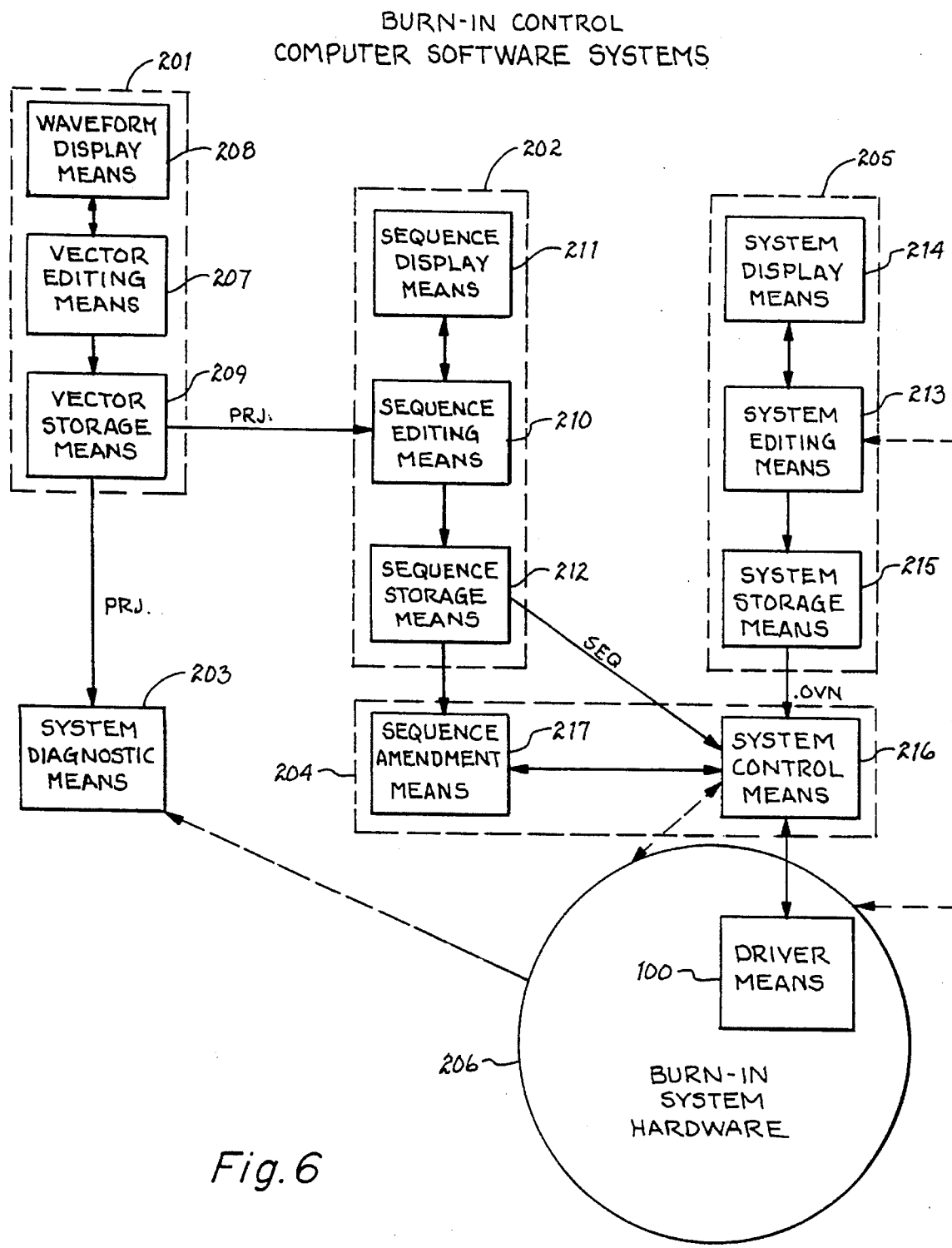
FIG. 6 is a block diagram of the computer software system for burn-in control of the present invention.

FIG. 6 is a block diagram of the computer software system for burn-in control of the present invention which shows more specifically the structures and major functional connections of those software systems (more specifically elsewhere described). As shown, the wave form editor application 201 includes vector editing means 207, waveform display means 208 and vector storage means 209. The sequence editor application 202 includes sequence editing means 210, sequence display means 211, and sequence storage means 212. The system editor application 205 includes system editing means 213, system display means 214 and system storage means 215. The system control application 204 includes system control means 216 and sequence amendment means 217. The burn-in system hardware 206 includes driver means 100 (the universal driver system previously described in detail herein and in the parent application).

Functionally, in the system of FIG. 6, the waveform editor application 201 permits independent setting as vector data of vector parameters for testing a semiconductor device. Waveform display means 201 permits graphic representation of test waveforms for multiple channels, to assist in such setting of vector parameters. Vector storage means 209 permits storing such vector data as an identified project file (.prj) to be used to configure driver means 100. The sequence editor application 202 permits independent setting as sequence data sequential parameters for controlling the testing of semiconductor devices. The sequence editing means 210 includes command means for including a project file from vector storage means 209 as a sequential parameter. The sequence storage means 212 permits storing such sequence data as an identified sequence file (.seq) to be used to control burn-in system hardware 206, including driver means 100. The system editor application 205 permits graphically setting as burn-in system data a burn-in system configuration for controlling the testing of a semiconductor device. System storage means 215 permits storing such burn-in system data as an identified burn-in system file (.ovn). The system control application 204 includes in system control means 216 command means for including a such burn-in system file from system storage means 215 and command means for including a such sequence file for use to control hardware 206, including driver means 100. The system control application 204 also includes sequence amendment means 217 for mid-test amendment of sequence parameters reactively in response to receipt from driver means 100 of selected test data concerning the semiconductor device under test. The system diagnostic application 203 includes system diagnostic means for testing the burn-in system hardware 206 and includes command means for using a project file (.prj) to reconfigure driver means 100. Waveform display means 208, sequence display means 211, and system display means 214 are preferably menu-based, interactive, graphic displays.

Figure 7:
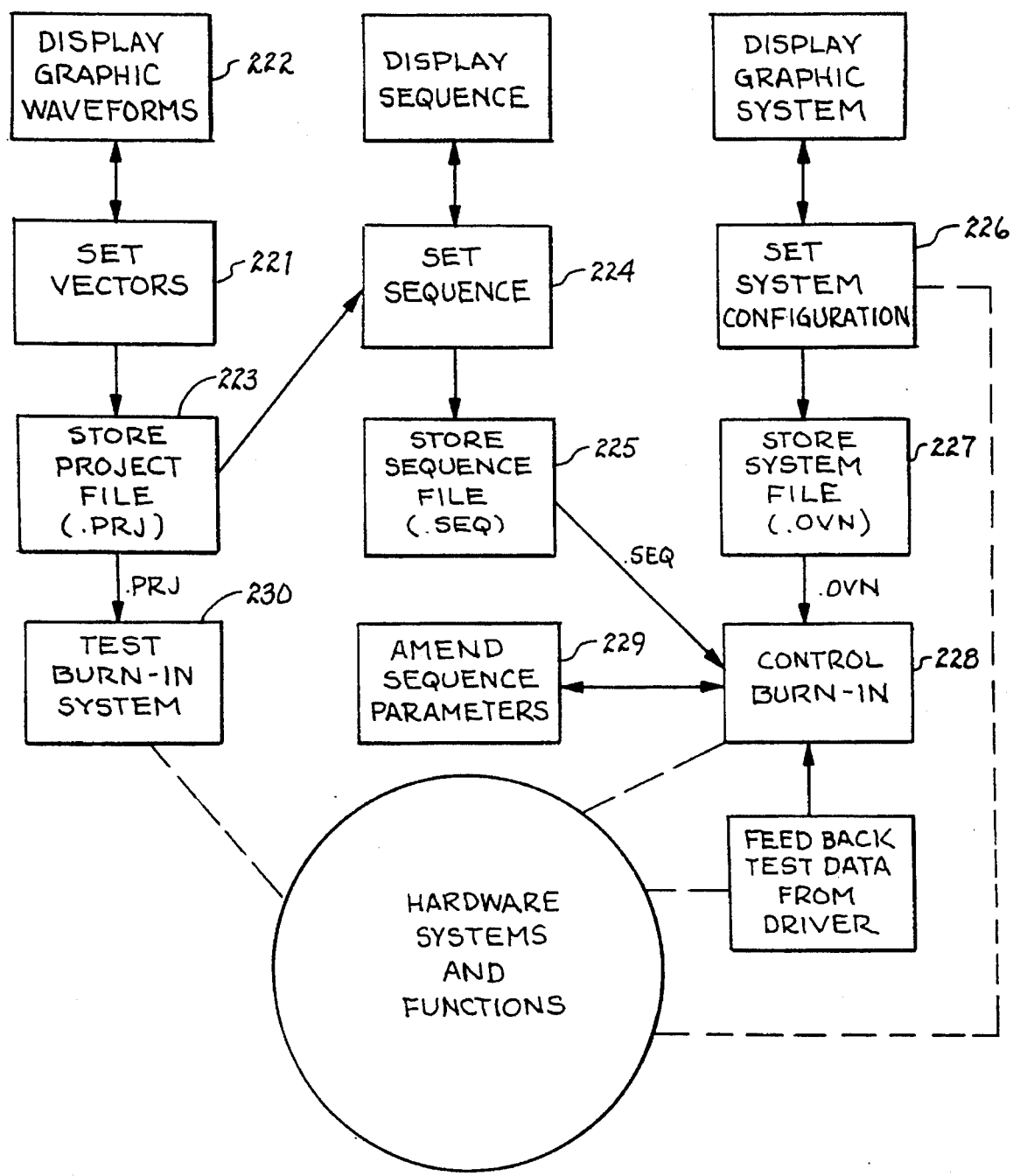
FIG. 7 is a diagrammatic chart of the steps of the system method of burn-in control of the present invention.

FIG. 7 is a diagrammatic chart of the steps of the system method of burn-in control of the present invention, showing the general flow among the steps of the system's method. Each box of FIG. 7 represents the step illustrated, with the solid-line connections between boxes representing a preferred order or flow among steps. The circle, as shown, represents the hardware systems and functions of the present invention. And the dotted lines show the steps involving interaction with such hardware. More specifically, the step SET VECTORS, represented by box 221, includes computer-setting as vector data vector parameters for testing a semiconductor device. The step DISPLAY GRAPHIC WAVEFORMS, box 222, includes computer-displaying graphic representation of test waveforms for multiple channels during such computer-setting of such vector parameters. The step STORE AS project FILE (.prj), box 223, includes computer-storing such vector data as an identified project file (.prj) and in form for use to configure burn-in driver means 100. The step SET sequence, box 224, includes independently computer-setting as sequence data sequential parameters for controlling the testing of semiconductor devices and including as at least one of such sequential parameters a such project file. The step STORE AS sequence FILE, box 225, includes computer-storing such sequence file as an identified sequence file and in form for use to control the burn-in hardware, including burn-in driver means 100. The step SET SYSTEM CONFIGURATION, box 226, includes graphically computer-setting as burn-in system data a burn-in system configuration for controlling the testing of semiconductor devices. The step STORE AS SYSTEM FILE (.ovn), box 227, includes computer-storing such burn-in system data as an identified burn-in system file. The step CONTROL BURN-IN, box 228, includes computer-controlling such burn-in system and including one such burn-in system file in such computer-controlling and including one such sequence file in such computer-controlling. The step AMEND sequence PARAMETERS, box 229, includes mid-test amending of sequence parameters in response to computer receipt from such driver means of selected test data concerning semiconductor devices under test; and the step FEED BACK TEST DATA FROM DRIVER, box 231, includes providing for such computer receipt of such selected test data. The step TEST BURN-IN SYSTEM, box 230, includes computer-testing such burn-in system including such driver means and providing the ability to use a project file to reconfigure such driver means.

It is preferred that the host PC computer system have the following hardware and software configuration to install and run the software of the present invention successfully: Microsoft@ Windows@ Version 3.1 or later, running in a standard or 386 enhanced mode; a 386 PC or better; MS-DOS@ 5.0 or later; 100 MB free hard disk space; 8 MB memory; one 5.25-inch high-density disk drive, or one 3.5-inch high-density disk drive; Microsoft@ mouse or compatible pointing device; and SVGA Monitor (17 in. or larger recommended).

The present system significantly reduces the time to design drivers and change testing parameters. The burn-in design cycle can now be reduced to several hours. Instead of designing new drivers and setting test parameters by hand, the user can use the system's software applications and almost instantly re-configure a burn-in driver to test a new DUT. The user may construct a sequence of projects. The user can change patterns, voltages, frequencies, etc., to build projects quickly and easily through the software which eliminates need to design new drivers. Then at the chamber level the system controller is used to download sequences and projects to different driver boards 100. Through the instant software applications, the user can enter an information file into the system for one driver. The user can then quickly change the testing parameters and change the driver 100 to test a different DUT. The user no longer needs to manually input the test parameters at the hardware level. The various software applications of the present invention allow the user to directly import vectors of information and to quickly choose the voltages, frequencies and other hardware capabilities without having to design new, or modify old, equipment.

Each of the software applications of this invention are responsible for a small segment of the burn-in process. The presently preferred system contains six software applications that aid the user in performing burn-in process. The system's security program provides that each user must obtain security access in order to run any of the system's software applications. The system controller application directs the burn-in cycle, allowing the user to view DUT failures as they occur. The user can also use this application to move between processes (i.e. system view, to chamber view to zone view). The universal diagnostic shell application (UDS) is an internal tool that allows the user to test BIBs, drivers and other system hardware. This application exercises the drivers. The system editor application allows the user to create a graphical depiction of the location of drivers and BIBs within the system. The waveform editor (also called vector editor) application allows the user to input information to create new projects, or modify previously stored projects. This is where the user enters the data (i.e., frequency, voltages and test patterns) that varies from one product to another. The sequence editor application allows the user to program the burn-in cycle to the drivers by creating sequence files that contain Events, Actions and other features executed at run-time.

The software of the present invention contains four distinct areas. Each area is dependent on the other. In the security layer area each user gains access to all system applications. The editor family layer area contains the editor files used to create files or documents necessary for a complete and vigorous design flow of information to the hardware. The editors allow the user to easily create projects, sequences, and graphical depictions of a system. The engineer will spend the most time working in this area. The editor family layer includes a full list of features specific to each editor. A consistent user interface remains throughout all applications. The system family layer area contains applications that converse with the system hardware boards. This layer allows the user to graphically display systems and chambers, configure drivers, and monitor for errors on the DUT level. The system family is responsible for hardware and maintains the hardware's integrity. In the diagnostic layer area, the user may confidence test the hardware. This layer is not only responsible for handling the diagnostics for one type of driver, but could handle all types concurrently if the case existed. In this layer the user must set up a specific driver that operates on the bit level and then toggles the bits ON or OFF located on the driver board.

Figure 8:
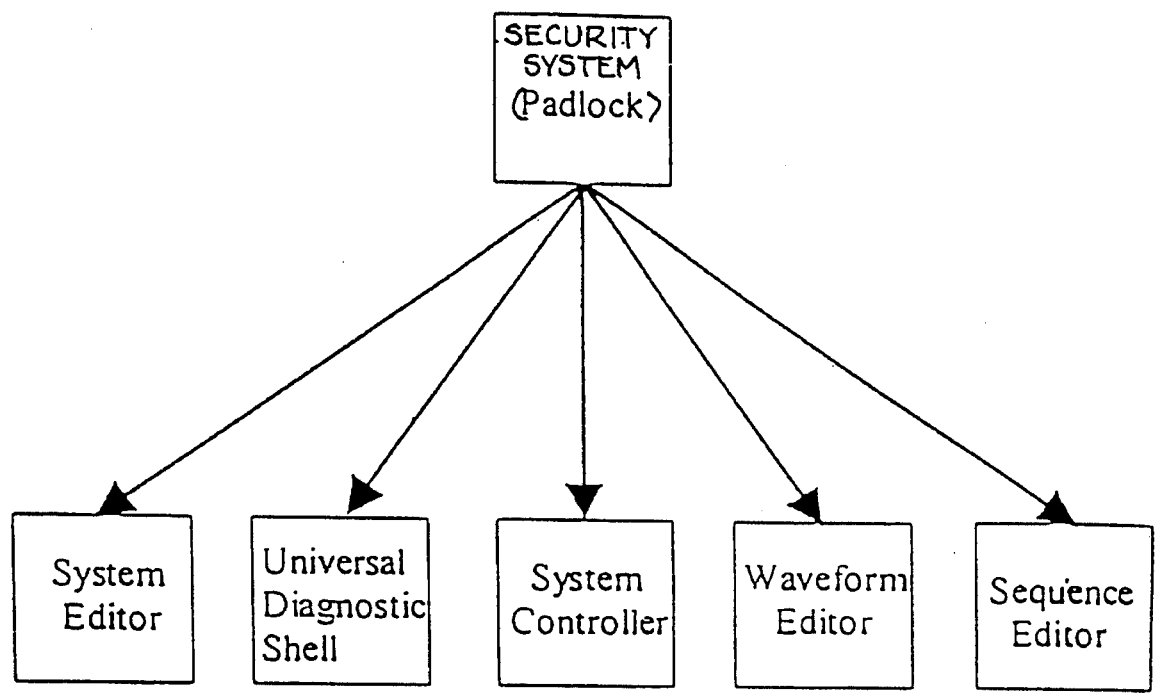
FIG. 8 is a block diagram showing the interaction of the security system with the other applications of the present invention.
Figure 9:
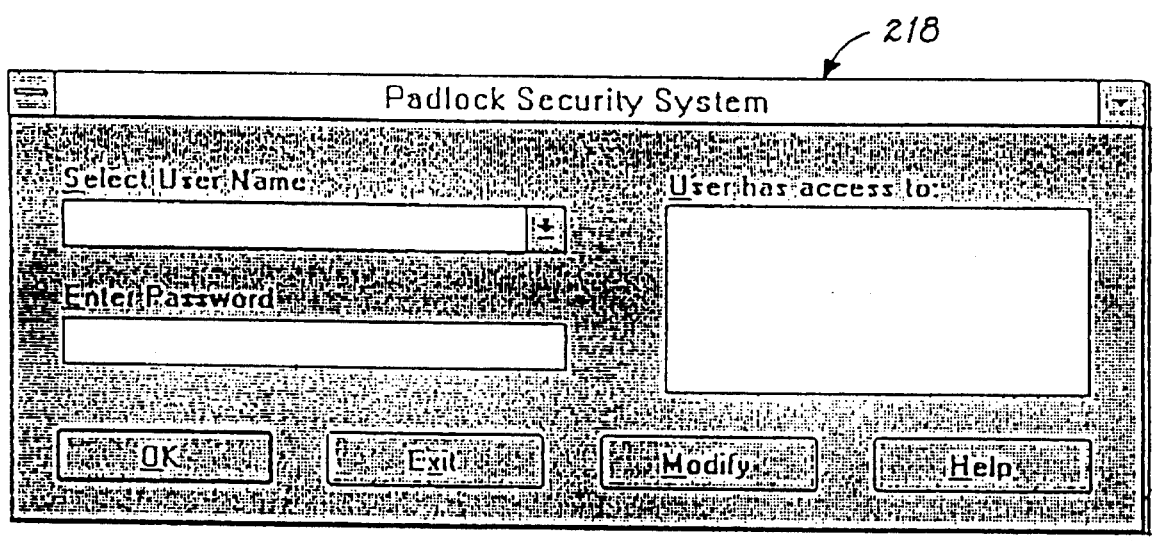
FIG. 9 is a pictorial illustration of the initial security system display screen.

As to the software application's security system, the user must have access to security in order to run any application in the system. The user can run the security system directly by entering the security system icon or by starting any of the other system applications. The security system requires a security key that allows the system to run. This key fits on the parallel port of the computer. If an application is running, and a user removes the security key, all system applications will close. The goal of the security system is to maintain the overall system's software's integrity. Without the security system, none of the other system applications will run (see FIG. 8). For example, from the opening software screen showing icon entries to all of the system's applications, if the user clicks the UDS icon twice with the mouse pointer to open that application, the initial security screen 218 (see FIG. 9) will appear. The user then selects a user name from a drop down list, enters a password, and clicks OK. If the user exits, the security system will quit. In fact, if the user decides to close the security system while still in any application (e.g., system editor, sequence editor, etc.), the security system will automatically close all system applications.

In any company that installs the system of the present invention, preferably one user receives the designation of administrator. The administrator has the ability, through the security system, to maintain a user list. The administrator can add or delete the number of users on the system, as well as selecting the programs that an employee can use. The administrator also gives each user a security level and a password used to run the various system applications. So each user that works with the present system preferably receives a separate password that needs to remain confidential at all times.

The waveform editor 201 is an application in the present system that allows the user to program data information into a new project by creating a project file (.prj). The user can also continue to develop previously stored projects. This application presents an interactive method for editing vector data and driver settings for later use. The waveform editor display 208 presents each of the configuration elements for editing to the user in the form of pull down menus. Each menu is logically grouped to include all the same type of information which segregates the features of the system hardware for easy reference. The primary goal of the waveform editor 201 is to create a project file that can be used with any system driver 100. The files created by the waveform editor 201 are downloaded and used in two other system applications, the UDS 203 and the sequence editor 202. The development of waveforms is essential to the burn-in cycle of the present system. The waveform editor application 201 allows the user to easily program in a matter of minutes for a system driver 100 to be given a specific state. The waveform editor application 201 is the software compliment to the system drivers 100.

Figure 10:
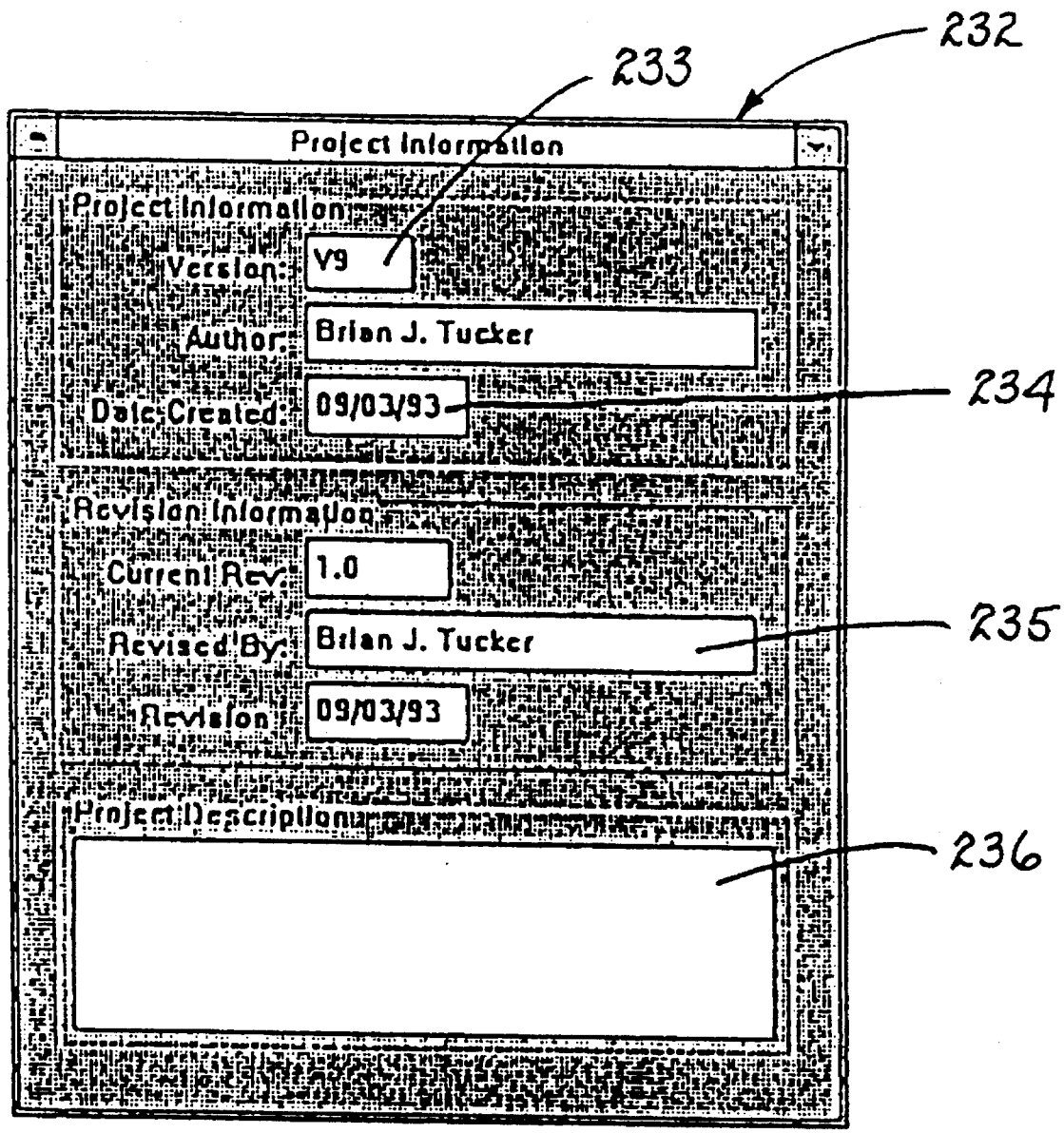
FIG. 10 is a pictorial illustration of the project control display screen of the waveform editor of the present invention.
Figure 11:
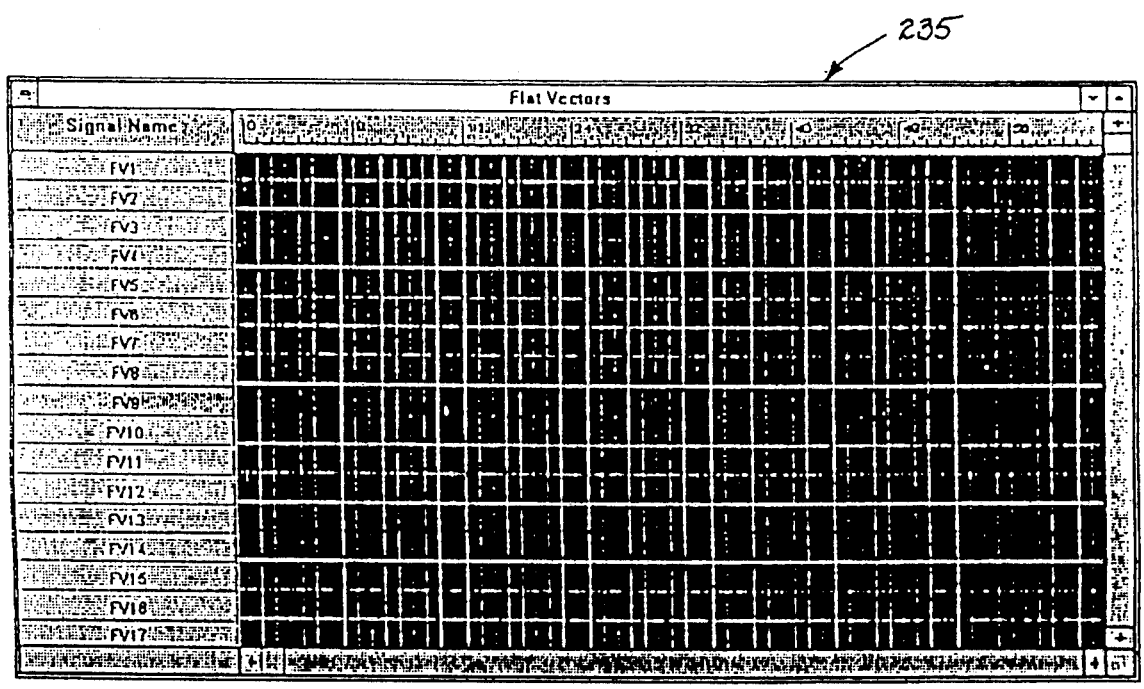
FIG. 11 is a pictorial illustration of the initial flat vector screen display of the waveform editor of the present invention.
Figure 12:
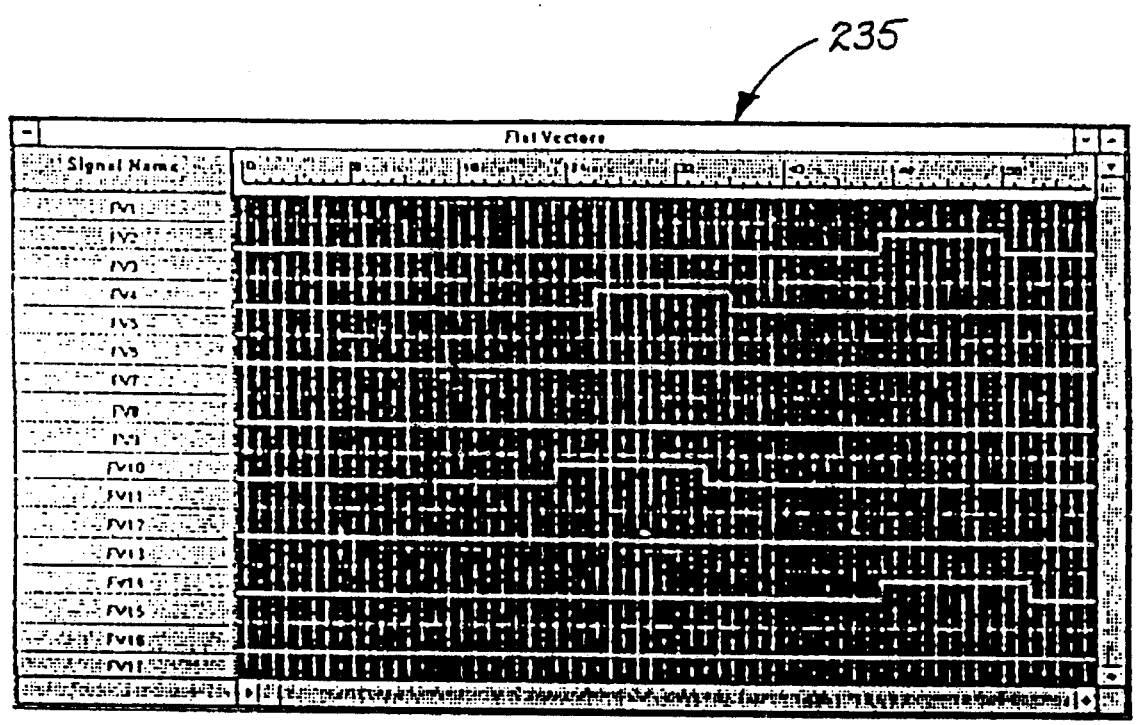
FIG. 12 is a pictorial illustration of a succeeding flat vector screen display of the waveform editor of the present invention.
Figure 13:
FIG. 13 is a pictorial illustration of the number base list box screen display of the waveform editor of the present invention.

The waveform editor application 201 supports a vast array of editing features for creating or modifying bit wise signals. The user can modify or program vectors to meet a specific need. Functions include ANDing, COMPLEMENTing, INVERTing, ORing, XORing, pulse generation, and address generation. The waveform editor 201 maintains project control (see FIG. 10) by requiring the user of the project information screen 232 to enter version number (at 233), the day the project was created or revised (at 234), the person who did the editing (at 235), and comments (at 236). The user can modify many features of the waveform. Some of these features may include: latched based features (e.g., frequency, voltage, idle settings), flat vectors, hold channels, sub vectors, tri-state control, and scan control. The user has the ability to create a digital channel, download the channels to a driver, and output the channels to a DUT as the drivers are run. The waveform editor 201 contains hold channels and flat vectors that are very simple to create and edit. In the system of the present invention, the user does not need extensive knowledge of the waveform editor 201 to modify or create a waveform. The modifications can be as simple as typing in a frequency or voltage change into the appropriate dialog box. The waveform editor display 208 graphically presents vector data in a timing diagram display. Various data points are displayed in waveform fashion with a different color for each information channel (see FIG. 11). The creation or editing of waveforms is just as easy. The user just has to click on a bit in the flat vector screen 235 and the vector is quickly changed (see FIG. 12). The user can choose which number base to enter the information about a particular waveform from the list dialog box located in the upper right hand corner of the screen (see FIG. 13): hexadecimal, decimal, binary, or octal. The user can also view the data in an addressed or time based format. In the preferred waveform editor 201 the user can input test data using Intel@ HEX, ASCII and Motorola@ S-record format, directly from the simulators and testers. The data is inputted automatically and mapped directly to the system hardware. Channel swapping supports simple and efficient re-mapping of signal output channels to the BIB. When selecting the tri-state mode in real-time, the signals graphically depict the tri-state levels. This feature determines when groups of signals are in the tri-state mode without reference to signal mapping charts. Historical and revision information records include automatic revision number incrementing, logged in user information and text comments. Other features of the preferred waveform editor 201 include: Open existing file, Save active document, Editing functions (i.e., Cut, Paste, Copy, and Print), Zoom in signal horizontally, Zoom out from signal horizontally, Zoom in signal vertically, Zoom out from signal vertically, Zoom in signal horizontally and vertically, Zoom out from signal horizontally and vertically, Display program information, version number, and copyright, and Display help for clicked on buttons, menus, and windows.

The system editor 205 allows the user to create a file (.ovn) that contains a description (number and position of chambers, drivers, and zones) of a particular system and the location of the drivers 100 within that system. When the user opens the application, the system editor 205 automatically scans the system for the number of installed drivers 100 and respective version IDs. There are two goals of the system editor: To provide a correct graphical representation of the burn-in system to the production user and to make the configuration of a driver 100 easy to understand; and to install system drivers 100 into the target burn-in chamber. The file (.ovn) created in the system editor 202 is used in another system application, the system controller 204. The accuracy of the chamber configuration is important since the .ovn file holds the user's view of the chamber as the drivers 100 are used. The configuration of the system should resemble the one that will be used on the production floor. The system editor 205 designs the interface between the hardware and software. The system editor hardware is essential for the chamber configuration to function successfully.

Figure 14:
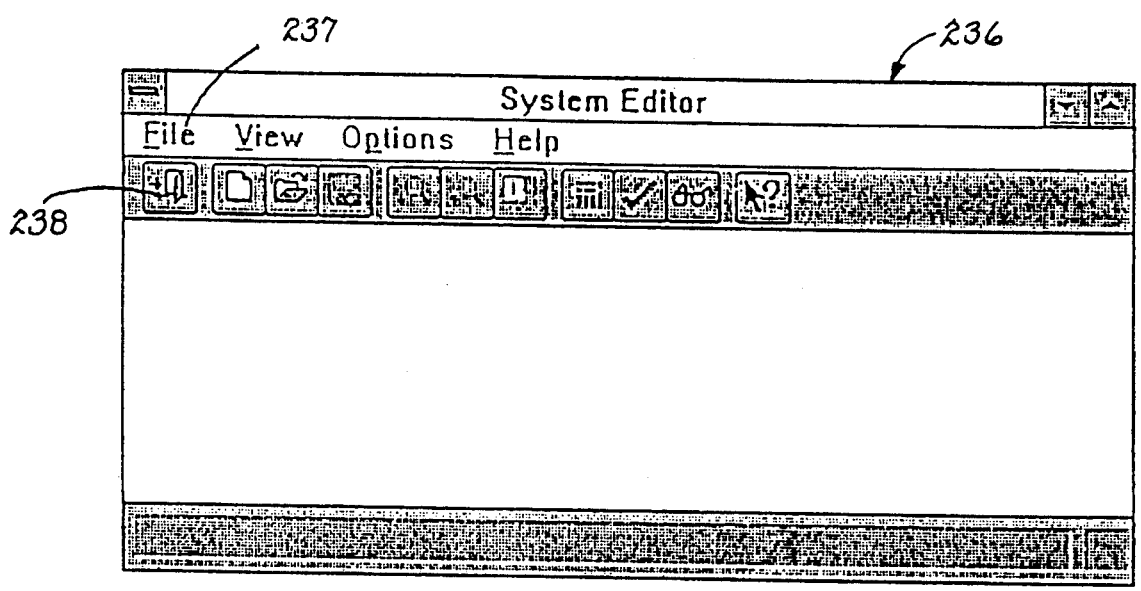
FIG. 14 is a pictorial illustration of the initial system editor screen display of the system editor of the present invention.
Figure 15:
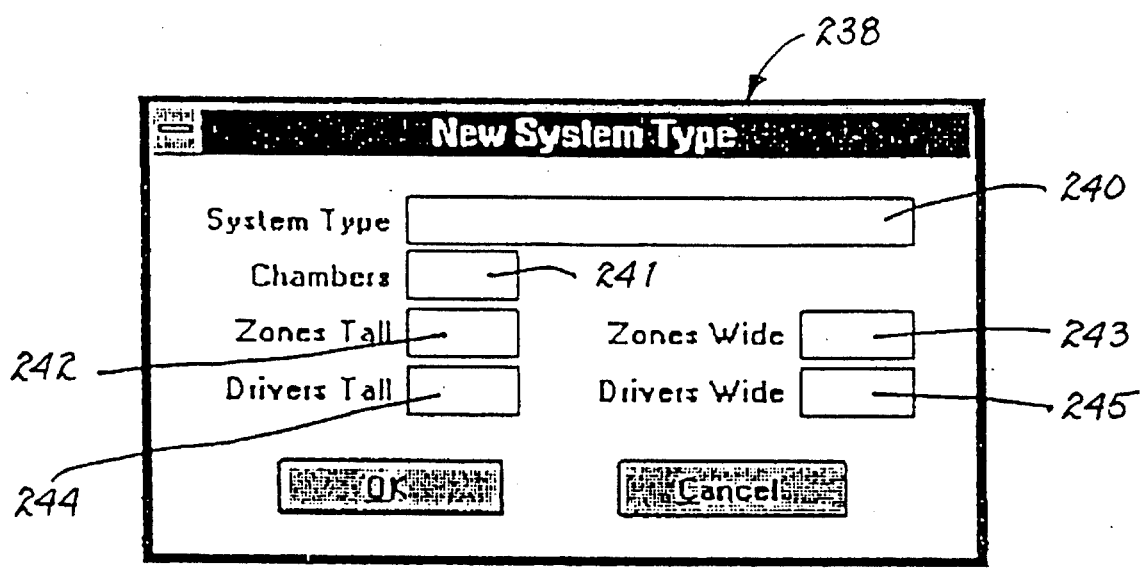
FIG. 15, is a pictorial illustration of the New System Type dialog box screen display of the system editor of the present invention.
Figure 16:
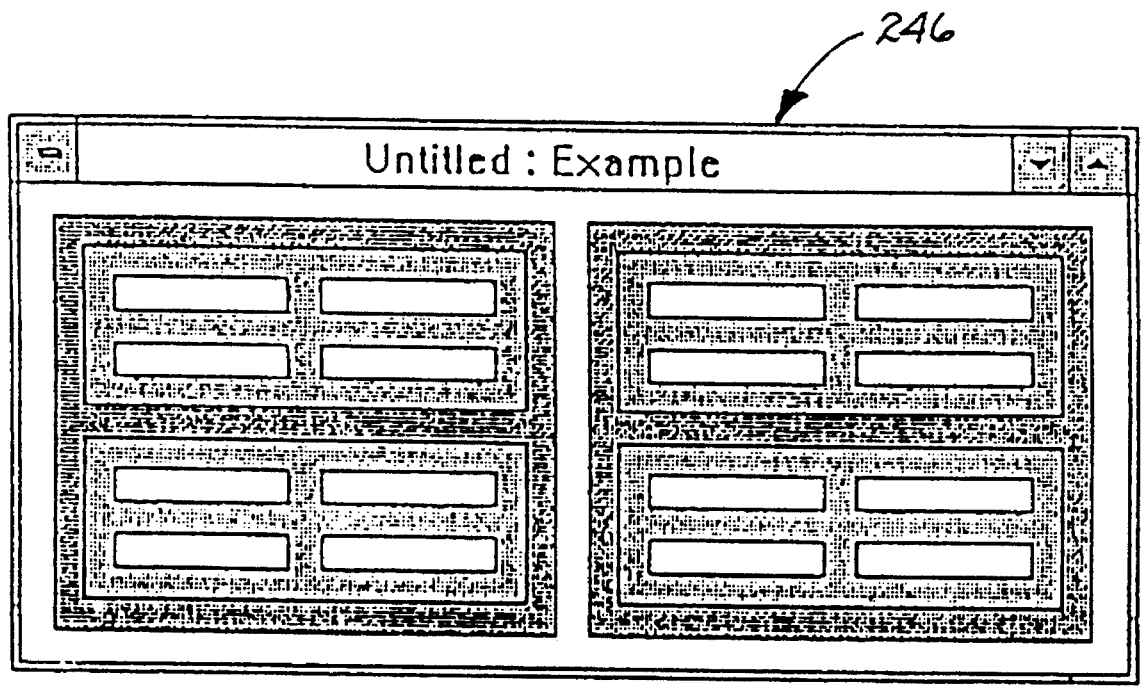
FIG. 16 is a pictorial illustration of a sample driver screen display of the system editor of the present invention.
Figure 17:
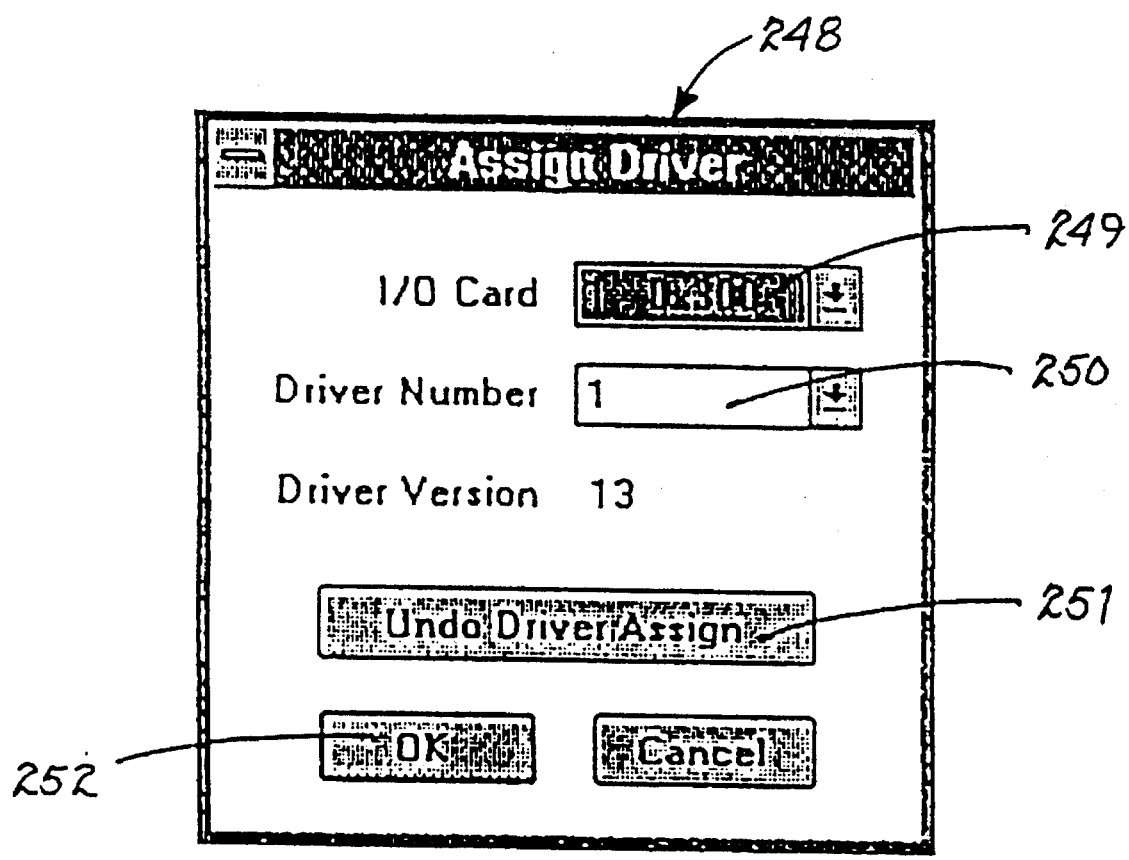
FIG. 17 is a pictorial illustration of an example dialog box screen display of the system editor of the present invention.

The configuration is a one time process. The user need only to design one configuration that is used by the system controller 204 to display the graphical representation of the system. For example, the user clicks the system editor icon twice with the mouse pointer to open the application. The system editor initial screen 236 (see FIG. 14) will appear. The user then selects either the File menu (at 237) or the new system file button (at 238) to create a new .ovn file. The New System Type Dialog Box 238 (see FIG. 15) is displayed. The user then enters a new system name (at 240), then enters the number of chambers (at 241), zones tall (at 242), zones wide (at 243), drivers tall (at 244), and drivers wide (at 245). For example, if the user types in 2, 2, 1, 2, 2 respectively, The system editor 202 then draws the system in display 246 without the drivers, as shown in FIG. 16. A driver is then selected by clicking a (white) driver-representation box. The Driver Dialog Box 248 (see FIG. 17) will appear. The user then enters the desired I\O card number (at 249) and driver number (at 250). The driver version number will be displayed (at 251), and the user clicks OK (at 252). The driver and .ovn file are now created. As previously mentioned, there are two ways to save a file: click the File Menu and then save; or click on the File Save button. The information is now saved as an .ovn file. To exit this application, the user clicks the exit icon. Some other features included in the preferred system editor are: Exit system editor, Open new system file, Load a system file, Save the current system, Zoom in, Zoom out, Re-size current system, Set the card address, Check which drivers are loaded, View the loaded drivers, and Activate context sensitive help.

To understand the sequence editor 202 of the present invention, one must know that, during a typical burn-in cycle, there are six basic steps that the user performs: (1) Download a project; (2) Set the idle settings and/or Actions and Events that will occur during the sequence; (3) Run the driver for any amount of time desired, during which time the user checks that the drivers are running, that the fuses are functioning, and that there are BIBs attached; (4) Download another project; (5) Set another period of time; and (6) End the sequence. Thus, previously, many of the actions of sequencing —i.e., checking the DUTs, replacing BIBs and drivers, monitoring the fuses, etc.—, were accomplished manually. The sequence editor 202 of the present invention allows the user to perform batch processing for a number of sequences, i.e., automation through the sequence editor 202 that allows the user to list any number of Actions and Events that will occur over a period of time quickly instead of having to perform the same steps manually.

Figure 18:
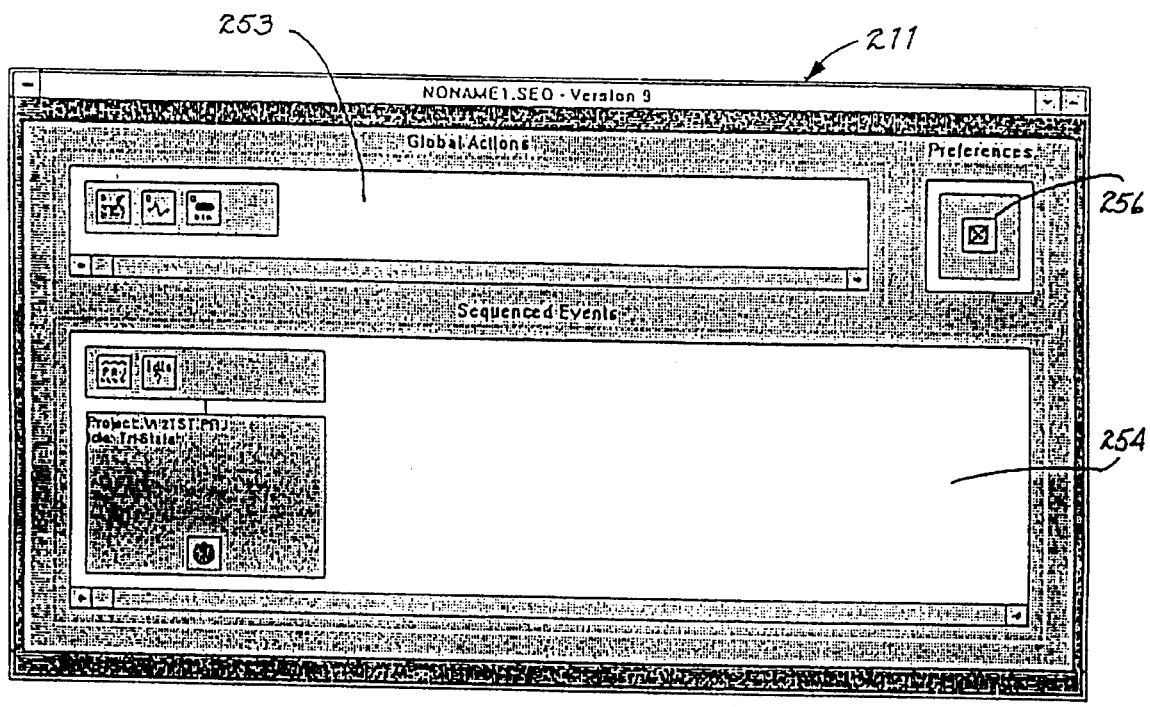
FIG. 18 is a pictorial illustration of the main screen display of the sequence editor of the present invention.

The sequence editor allows the user to create a new sequence, open a previously created sequence, or edit the sequence. Editing a sequence can involve many procedures. A user could add or delete Actions and Events contained within a sequence, move Actions and Events within a sequence, and/or add or delete global Actions. The sequence Editor display screen 211 is divided into three main areas (see FIG. 18). The Global Actions section 253 displays three actions that occur automatically during a sequence: checking the status of a driver; checking the fuses on the driver; and checking the existence of all marked BIBs. The sequenced Events section 254 displays the Events and Actions chosen by the user that will occur during a sequence. The larger window 254 is the Event. The smaller window 253 on the top of the Event is the Action. The Preferences section 256 allows the user to manually keep the sequence running. If the user does not select this box, the sequence will stop at the end of the cycle. project and pattern sequencing are useful to perform functional tests of DUTs. This application allows the user to select various chips to test on a regular basis. The user also has the ability to select different DUTs located at various positions on the BIB.

The goal of the sequence editor application 202 is to allow the user to create a sequence that exercises various features—i.e., voltage, frequency, etc.—of a particular driver type. The sequence editor 202 interacts with two other system software applications, the system controller 204 and the waveform editor 201. The sequence editor 202 takes the .prj file from the waveform editor 201 and places the information as an Action of a sequence. In this manner, the sequence editor application 202 creates a .seq file directly associated with the driver 100 tested by the system controller 204. The sequence editor 202 creates a sequence of events that tests the DUT under specific parameters over a given period of time. This application 202 allows for DUT testing in various controlled environments in one burn-in cycle. A sequence could be as simple as downloading a project or as complicated as setting voltages, frequencies, idle settings, vector delays and loops to repeat the test. The sequencing concept is a very powerful idea. Sequencing can accomplish almost all processes relating to the driver system of the present invention.

Figure 19:
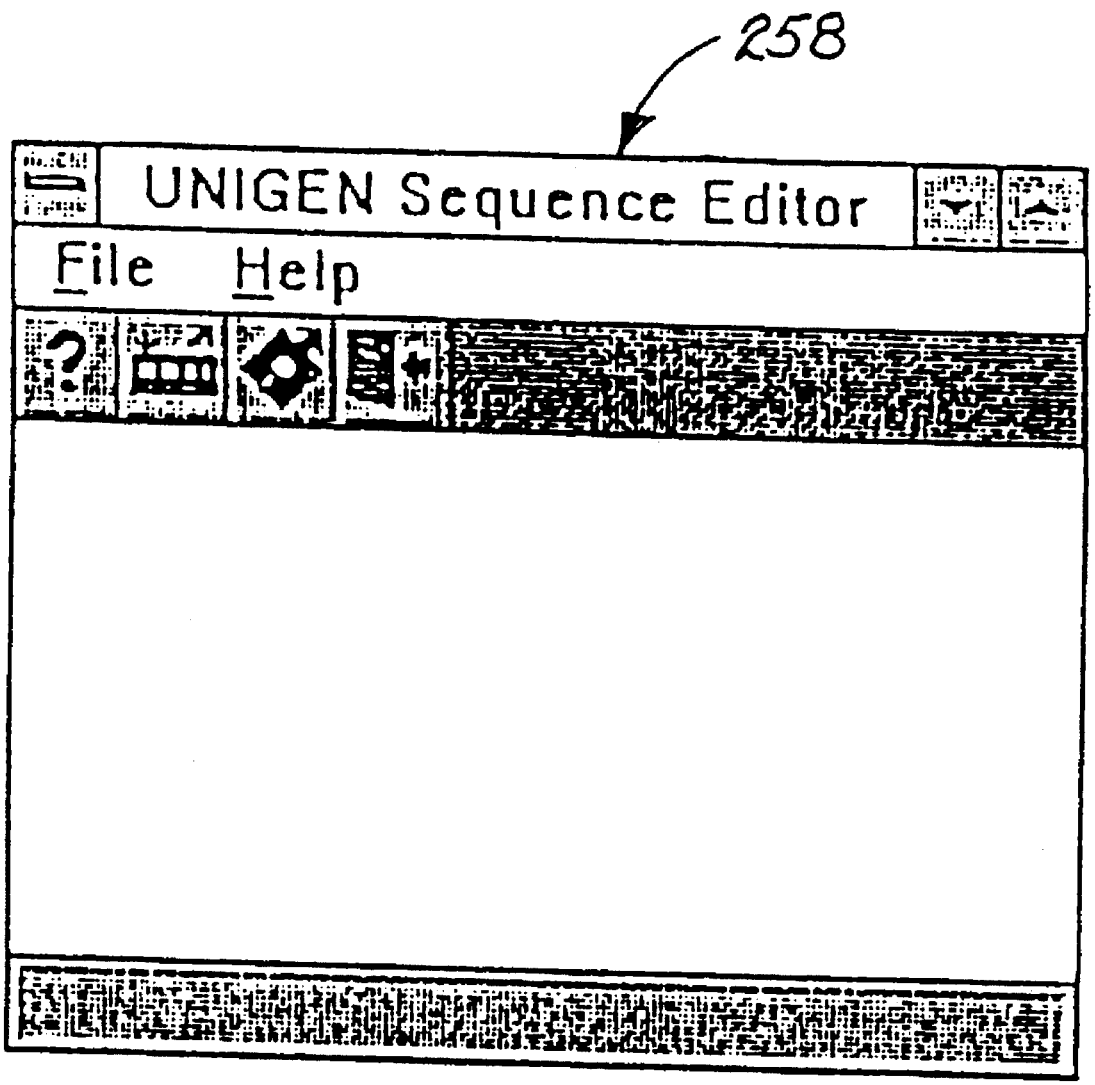
FIG. 19 is a pictorial illustration of the initial screen display of the sequence editor of the present invention.
Figure 20:
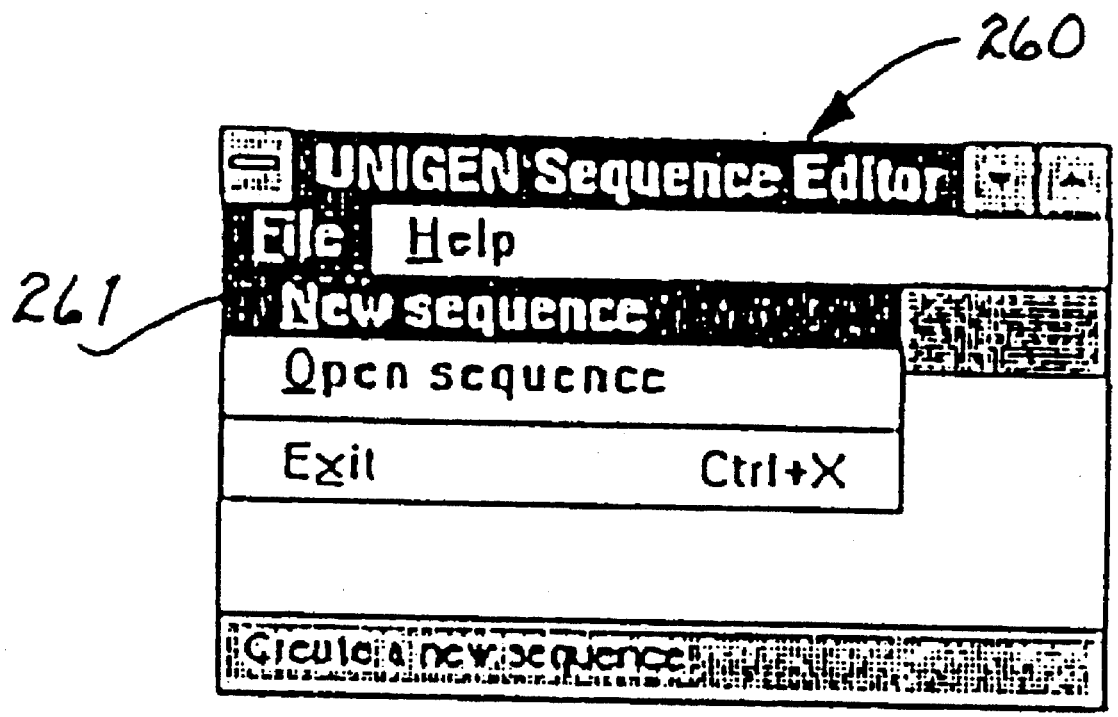
FIG. 20 is a pictorial illustration of the file menu screen display of the sequence editor of the present invention.
Figure 21:
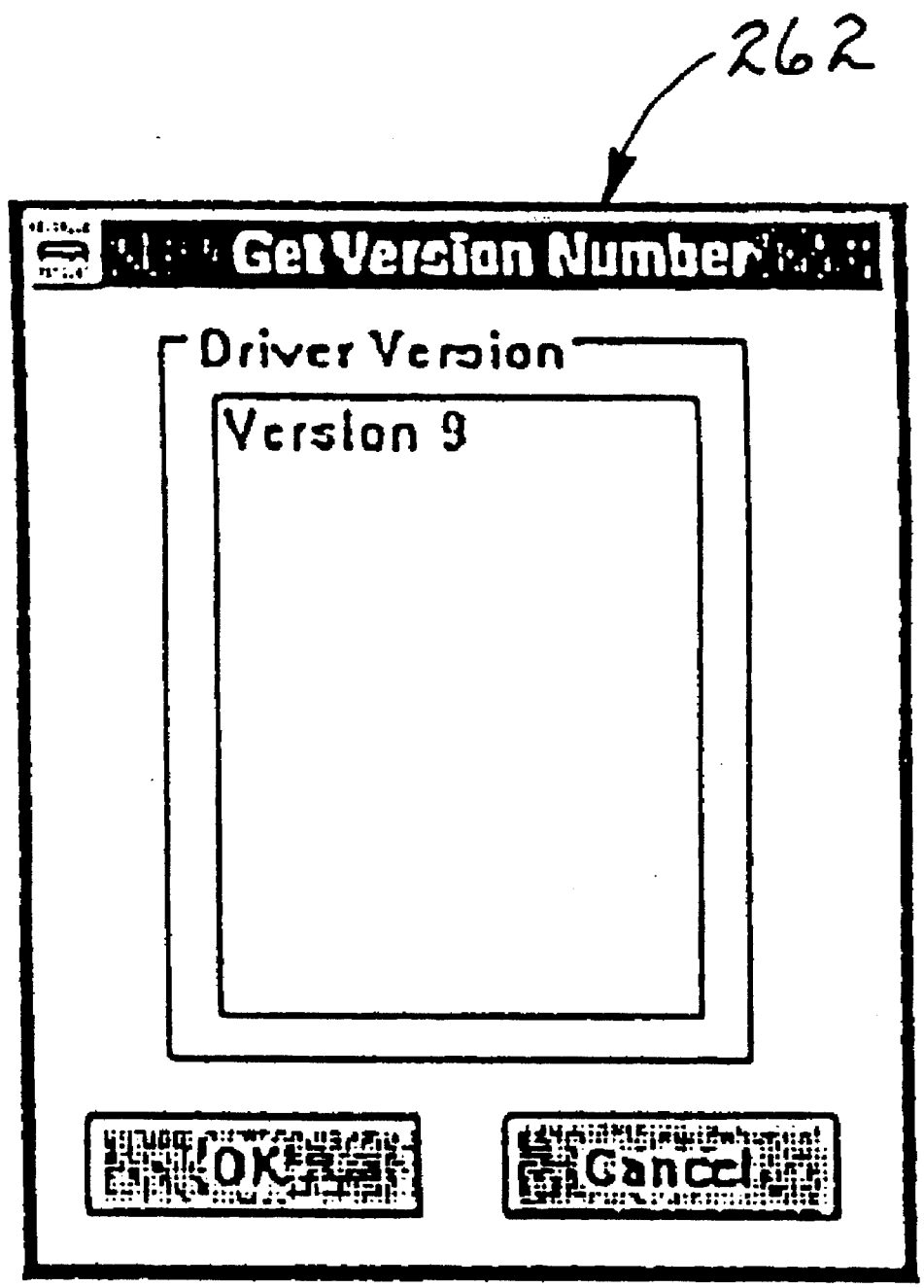
FIG. 21 is a pictorial illustration of the driver version dialog box screen display of the sequence editor of the present invention.
Figure 22:
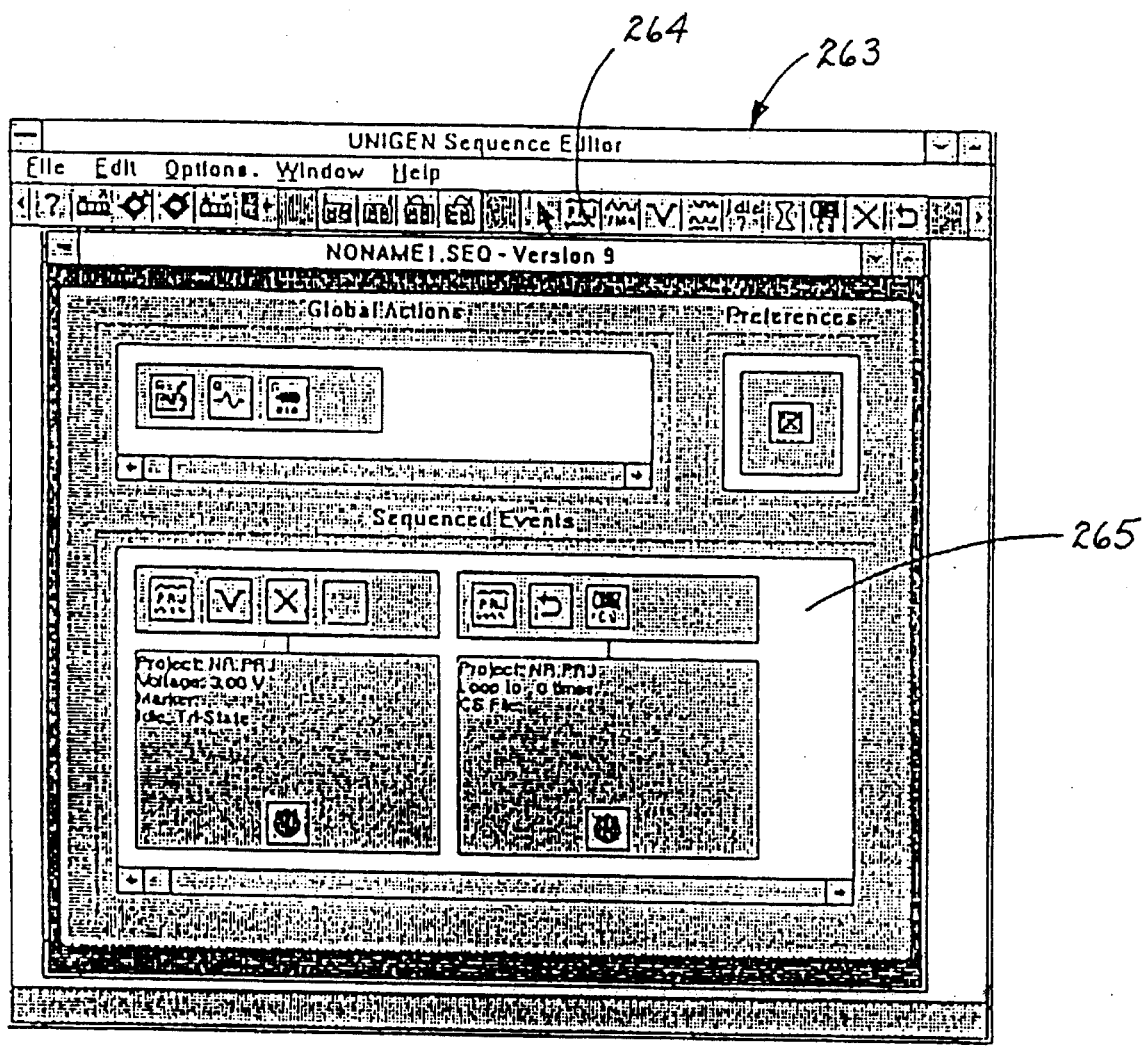
FIG. 22 is a pictorial illustration of a sequence editor screen display, showing events and actions, of the sequence editor of the present invention.
Figure 23:
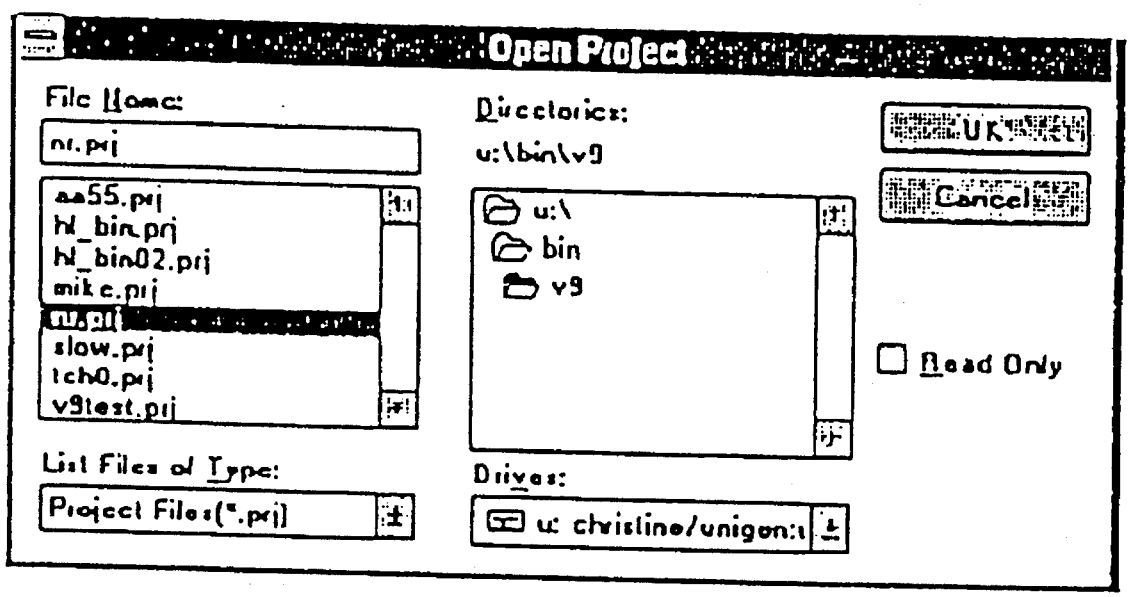
FIG. 23 is a pictorial illustration of a project list screen display of the sequence editor of the present invention.
Figure 24:
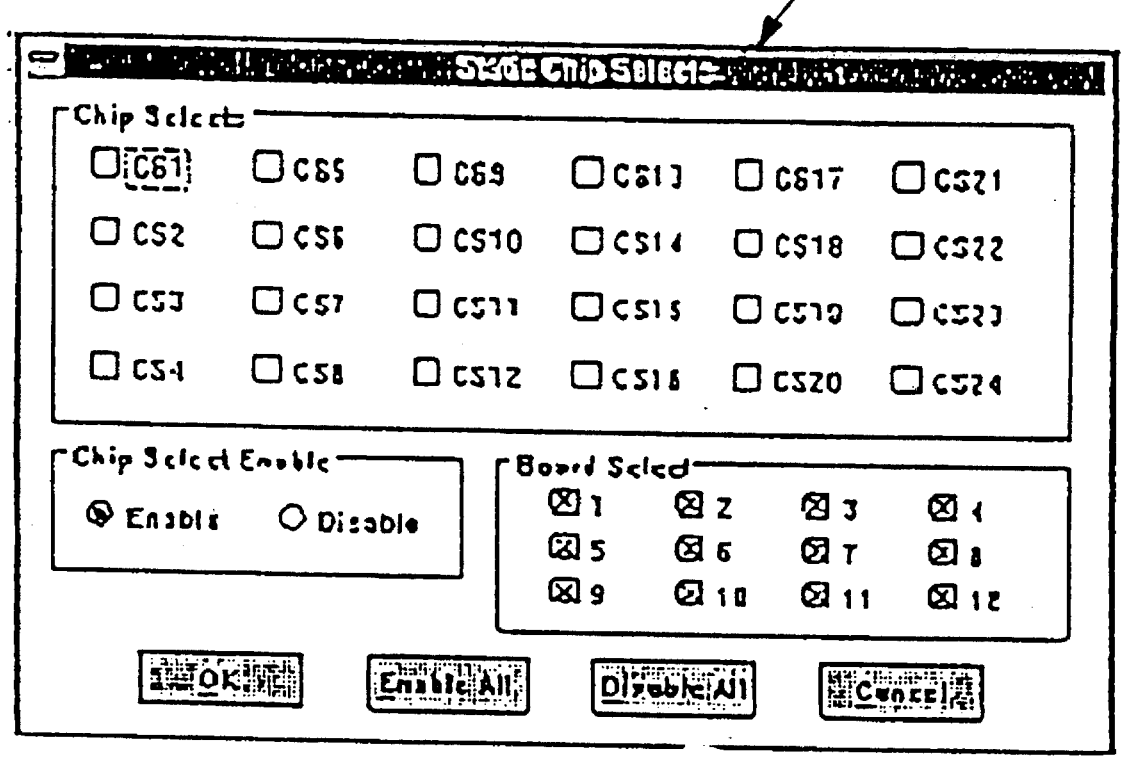
FIG. 24 is a pictorial illustration of a chip select screen display of the sequence editor of the present invention.
Figure 25:
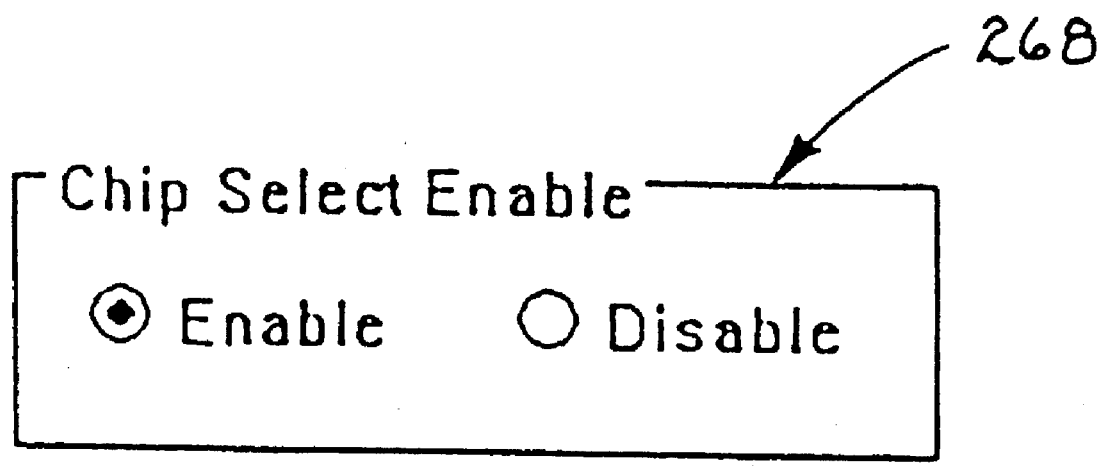
FIG. 25 is a pictorial illustration of a select enable dialog box screen display of the sequence editor of the present invention.
Figure 26:
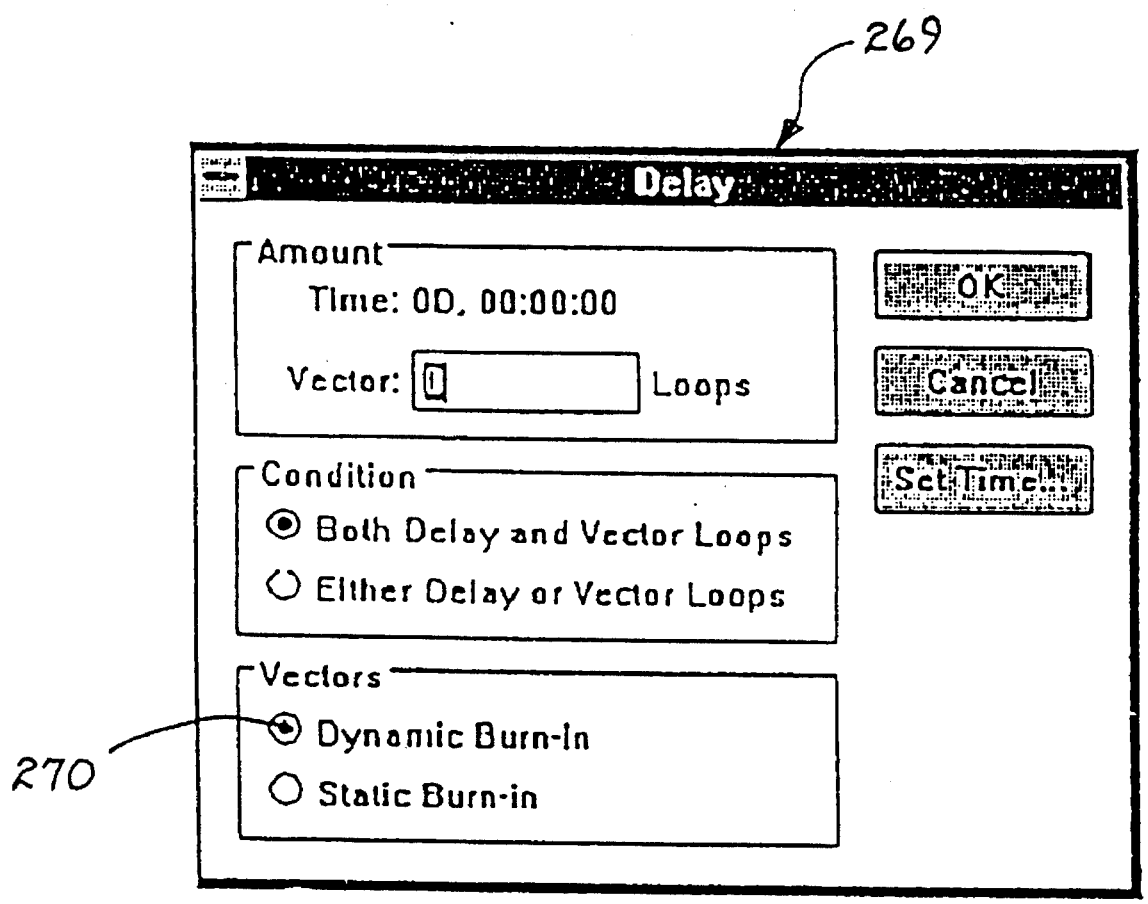
FIG. 26 is a pictorial illustration of a loop counter dialog box screen display of the sequence editor of the present invention.

To operate the sequence editor 202 in a preferred embodiment, for example, the user may proceed as follows. To open the sequence editor 202 from the main system screen, the user clicks the mouse pointer on the sequence editor icon twice. The initial sequence editor screen display 258 (see FIG. 19) will appear. The user then clicks the File menu in the upper left hand corner once to open a specific file. The File Menu screen 260 (see FIG. 20) will appear. The user can choose to open an old or new sequence. If the user clicks "New sequence" (at 261), the Driver Version Dialog Box 262 (see FIG. 21) appears. The user may, for example, choose Version 9, then click OK. The main sequence editor screen 263 is then displayed (see FIG. 22). (Preferably, the sequence editor 210 automatically calls the sequence noname.seq.) By default, the sequence editor application 202 places three global actions into the sequence: driver conditioning; fuse monitoring; and BIB monitoring. The next step is to create an event for the sequence to download to the project. The user selects the project button 264 near the top of the screen and places the cursor into the sequence events window 265. The cursor will change as it enters the sequence Events window 265. The user then clicks the left mouse button to place projects, Actions, and Events. Clicking the mouse button lists the different projects from which the user can choose to save the sequence (see FIG. 23). The user selects, for example, nr.prj and clicks OK. The user then selects the static chip select button near the top of the screen, and the Chip Select screen 267 (see FIG. 24) is displayed. At this time, for example, one chip and one board may be selected. Then the Select Enable Box 268 (see FIG. 25) is clicked and click OK. The user then selects the delay button which displays the Delay Dialog Box 269 (see FIG. 26). The user may, for example, choose dynamic burn-in box (at 270). Any number of vector loops can be chosen. For example, the user may select 20 vector loops on the counter box. Then, under the File box, the user may choose "Save as" and store the file under, say, kf.seq., and click OK. The sequence will now be saved. The user may exit the application by either clicking the exit button or by way of the File menu.

It is noted that, in a preferred version of the software system of the present invention, the right mouse button allows the user to place a red dotted line around an Action or an Event so that particular function can be modified within a sequence. Also, the number of times the end of a vector set has been reached is counted and displayed. The Preference function allows the user to manually stop a sequence. Note that the user has to physically tell the sequence editor 202 to stop or the sequence will continue to run. Some other features included in the sequence editor 202 of the present invention are: Display help index, Create a new sequence, Open an existing sequence, Save this sequence, Close window, Exit sequence Editor, Add event(s) to beginning of a sequence, Add event(s) to end of a sequence, Move event(s) to beginning of a sequence, Move event(s) to end of sequence, Download a project to a driver, Update a frequency setting on a driver, Update the voltage settings on a driver, Download a pattern file to a driver, Set the idle frequency setting for a driver, Set the vector delay settings for a driver, Perform a chip select with a driver, Perform a static chip select with a driver, Mark an event for later reference, Loop to a marked event, Check the status of a driver, Check the fuses on a driver, and Check for the existence of all marked BIBs.

Figure 27:
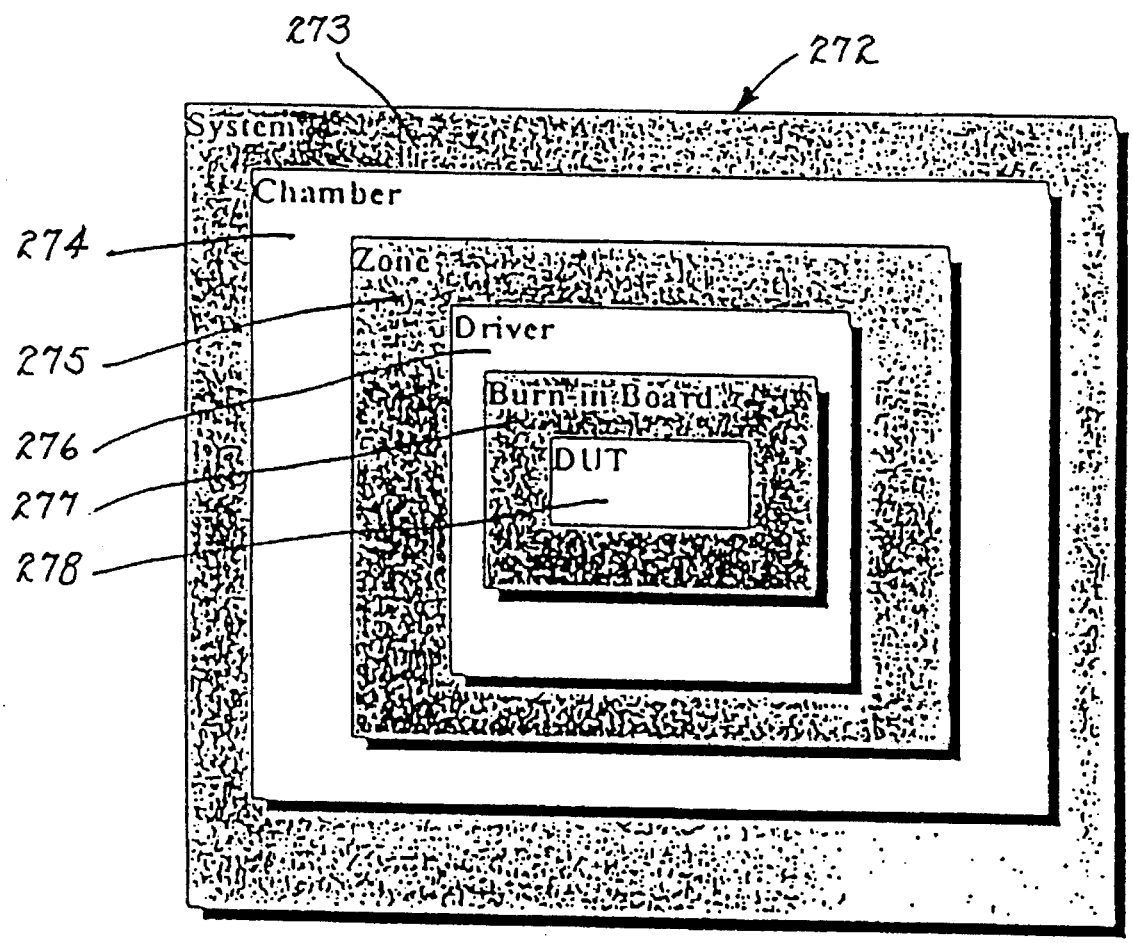
FIG. 27 is a pictorial illustration of a system hierarchy screen display of the system controller of the present invention.

The system controller 204 of the present invention is the application that controls the actual burn-in testing of the DUT. The system control application 204 gives the user the ability to manage execution of the sequence and to monitor drivers, BIBs, and DUTs on the production floor. The user can view the number of chambers, zones, BIBs, drivers, and DUTs associated with any given system upon execution of the program. This application displays 272 the information about a file in a hierarchical manner: the system information 273 first, then the chamber 274, zone 275, driver 276, BIB 277 and the DUT 278, (see FIG. 27). In a preferred embodiment, The system controller's design supports a touch screen capability. Each feature on the screen is large enough for a finger. The primary goal of the system controller 204 is to give the user a simple, efficient way to manage the resources of performing burn-in at chamber to chamber level. The system controller 204 is the last level of preparing for testing a particular DUT. The system control application 204 incorporates information from all other system applications into a simple overview for testing.

Figure 28:
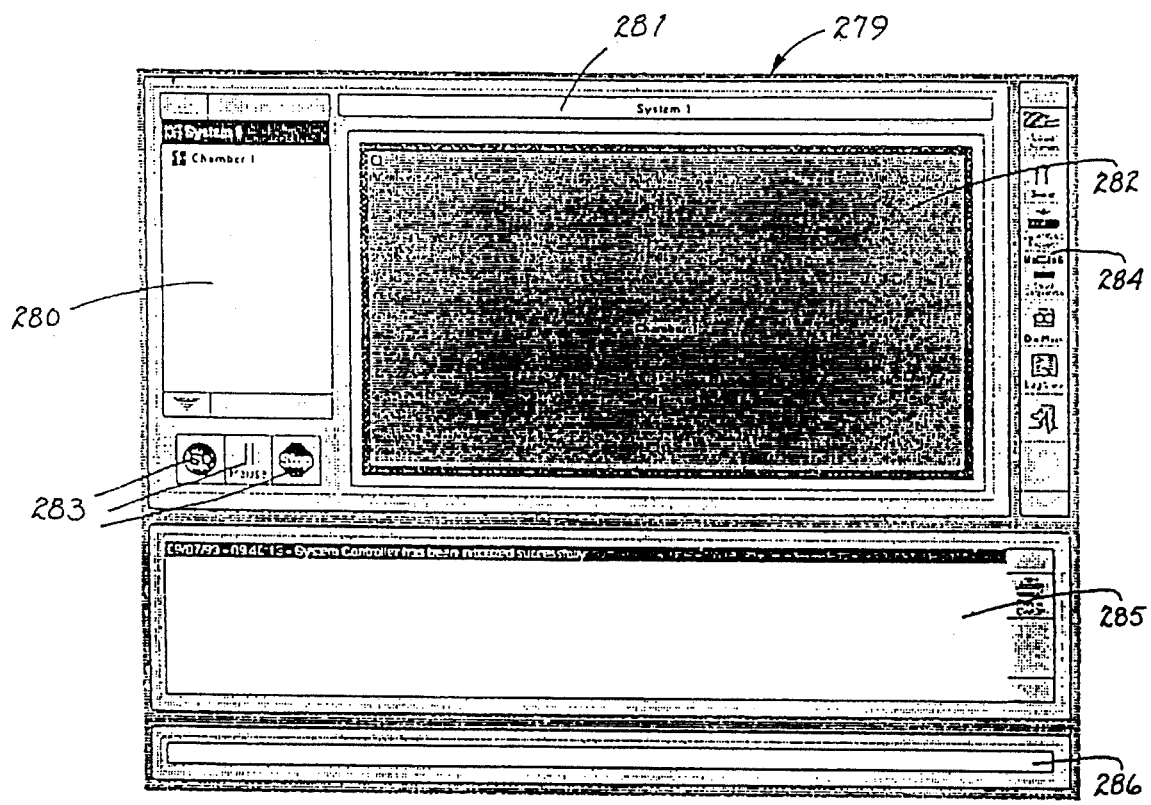
FIG. 28 is a pictorial illustration of the main screen display of the system controller of the present invention.
Figure 29:
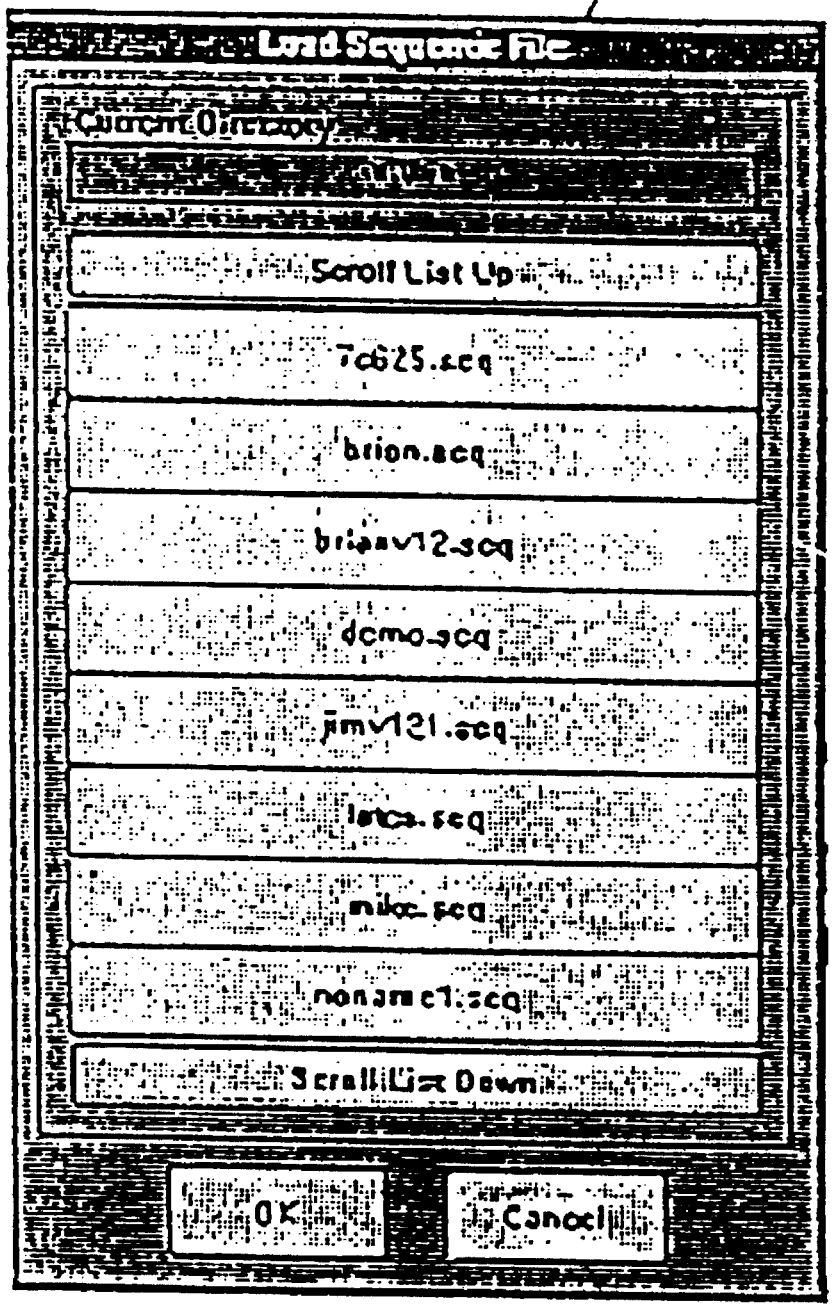
FIG. 29 is a pictorial illustration of the load sequence screen display of the system controller of the present invention.

The system controller 204 may be operated, for example, as follows. The user may click the system controller icon twice with the mouse pointer to open the application and the main screen 279 will be displayed (see FIG. 28). This screen 279 is displayed into seven major sections. The far left window is the System Selection Window 280 that displays the available systems, chambers, zones, driver boards, BIBs and DUTs in hierarchical manner, as previously described. The window at the top of the screen is the Title Window 281 that shows the systems, chambers, etc., that the user is currently testing. The window below the title screen is the Viewer Window 282 that displays the available BIBs. The section below the System Selection Window 280 holds the buttons 283 that the user applies to start, stop and pause the system testing. The button bar 284 on the far right side holds the icons used for various features of the system controller 204 (i.e. load sequence, DUT masking, Log View, etc.). The window below the View Window 282 is the System Log Window 285. This window displays messages about the system, such as successful or driver fail notices. The user always logs this material to a disk or an external source, such as a printer. The window at the bottom of the screen is the Status Window 286. This window 286 displays brief how-to help messages for the user about various applications. The user may then select a driver by clicking the View Screen which will change colors. In a preferred embodiment hereof, there is a color scheme associated with the main screen when it displays chambers, drivers, etc. The code is green when the device (driver, chamber, etc.) is present, blue when the device is selected, and gray when the device is not present. The user may load a particular sequence by clicking the sequence button located on the right side of the screen on button bar 284. The Load sequence Screen 287 (see FIG. 29) will be displayed. The user can select the desired sequence, by either clicking on the sequence name and then choose OK, or clicking the sequence twice. This action loads the information necessary, number of chambers, BIBs, zones, etc., to test the sequence. The main color screen 263 will return to a non-selected state. The user then re-selects the driver. The sequence is now ready to run. The user may now select GO. The report on the status of the test will appear in the System Log Window 285. When the sequence is running, the user has the option to print the test results to the printer by clicking the printer icon once to enable the printer. To disable the printer, the user clicks the icon again. In a preferred embodiment, while the test is running, the small square in the upper left hand corner of the main screen 279 will flash yellow. When the test is completed, the user may exit the application by clicking the exit icon on the right-hand side of the screen 279.

There are several ways to move between the components of a system. The user can either: click on the main screen twice until the desired component is reached; or click on the component in the System Selection Window 280 once and the rest of the system will be displayed. Some other features of the system controller 204 are:

(1) Load System—If there are changes to the system during testing, the user can click this button and the system controller 204 physically searches for and examines the changes and automatically implements them for testing.

(2) Setup—This button allows the user to select an .ovn file created in the system editor application 205.

(3) Load sequence—This button allows the user to select a sequence to be associated with the system.

(4) DUT Masking—If a DUT fails during testing, this button allows the user to hide the failed DUT and continue the test.

(5) Log View—This button allows the user to see the .log file, which contains the results of the test.

Some other features of the system controller 204 are: Exit UDS, Open burn-in driver version, Select a driver, Run a driver, Stop a driver, Download a project, Set voltage settings, Set frequency settings, Set special settings, and Program/Read EEPROM. Some of the features included in the settings menu are:

RUN—Allows the user to run the driver

STOP—Allows the user to stop the driver project—Allows the user to choose a project to download Board Select—Allows the user to select a board to test Chip Select—Allows the user to select one or more chips to test Delays—Allows the user to chose a skew delay on board edges with respect to vectors Delays Debug—Allows the user to fine tune skew delays Frequencies—Allows the user to change frequencies Fuse Cards—Allows the user to change fuse parameters on the BIB Idle Settings—Allows the user to tell the hardware what to do when it is not running Loop Counter—Allows the user to see how many times that a test has run Group Select—Allows the user to place any number of drivers together to run the same test on each driver Special—Allows the user to change driver debug parameters Voltages—Allows the user to set voltages EEPROM—Allows the user to record serial, product, and DUT information about a specific BIB Automated Tests—Allows the user to automatically
—Check the battery charge
  Select the board to be tested
  Check to see if board is present
  Check the fuse status Files—Allows the user to:
  Create latch file which retains driver settings information.
  Create .prj files
  Edit .prj files Options—Allows the user to view information about
  Dynamic Link Library (DLL)
  A toggle demonstration mode (used when no hardware is attached)

Monitoring the DUTs to discover failures is one of the most important parts of the burn-in process. In previous methods of burn-in, the user had to perform, by hand, six basic steps: (1) Insert the DUT onto a BIB and then connect it to the drivers; (2) Place system into the burn-in chamber; (3) Start the burn-in cycle and exercise the drivers; (4) Remove the BIB; (5) Remove individual DUTs off the BIB; and (6) Test each DUT in a high speed tester to see if the DUT passed or failed. When the user determined if the DUT failed or passed the test, the results were manually recorded. The user then proceeds to the testing of the next DUT.

With the system of the present invention, the user can monitor more than one DUT during the burn-in cycle. During test, the system controller 204 records information (i.e. errors, if the driver is initiated, how many DUTs are tested etc.) into a System Log File. The present system reduces the steps of DUT monitoring. First, the user downloads the project to the driver 100. The driver 100 contains the test parameter information and the expected results of the test. The driver 100 is set in run mode. The driver 100 then sends the data to the DUT, all as more particularly described hereinbefore and in the parent application. Next, the information is received from the DUT. And last, the driver 100 compares the expected results with the results from the test. If the resultant information does not match the expected results, the driver 100 records the mismatch as an error, otherwise the DUT passes.

The present system contains a Log Viewer application, located in the system controller software 204, that allows the user to view the log file and to post process the file for data analysis. The log file in the system controller 204 contains all the pertinent information about the test (i.e. number of failures, time the errors occurred, when the test was run, if the drivers were exercised, etc.), and displays it in a useful visual format. The user can display the data in several graphical formats. The System Log can count how many times that a particular DUT has failed and automatically log the error. When the failures are counted, the driver 100 resets the bit and the test is repeated. If the same error occurs, it is then entered into the log file for later retrieval.

Turning to the system diagnostic application 203, the UDS application 203 is an important and useful part of the system of the present invention as a diagnostic tool. The UDS 203 allows the user to have an internal tool in which to test the BIBs, drivers, and other system hardware items associated with the burn-in process. The testing of the system hardware occurs on a manual level where the user can change the setting parameters (i.e. voltage and frequency). The UDS 203 allows for the testing of multiple versions and features of burn-in driver boards. The main goal of the UDS 203 is to provide the user direct control over the testing of all hardware aspects. The UDS 203 primarily interacts only with the hardware. However, this application 203 does use project information from the waveform editor 201 (refer to FIG. 5.1) and tests such information on the driver 100. The UDS 203 is a low level program that communicates directly to the hardware. It is noted that, before the UDS 203 can test any hardware for a particular version, a latch file must be created.

Figure 30:
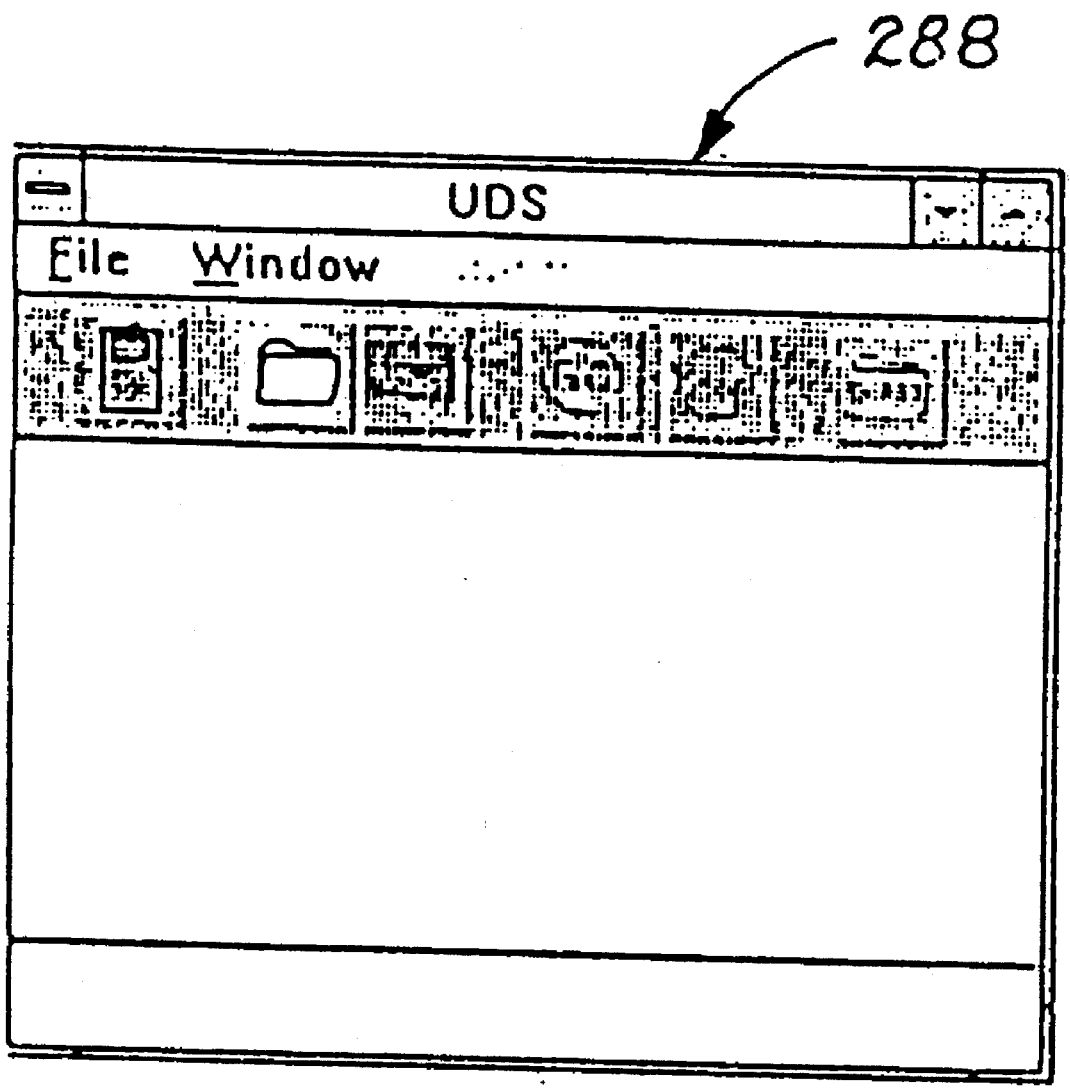
FIG. 30 is a pictorial illustration of the initial screen display of the system diagnostic application of the present invention.
Figure 31:
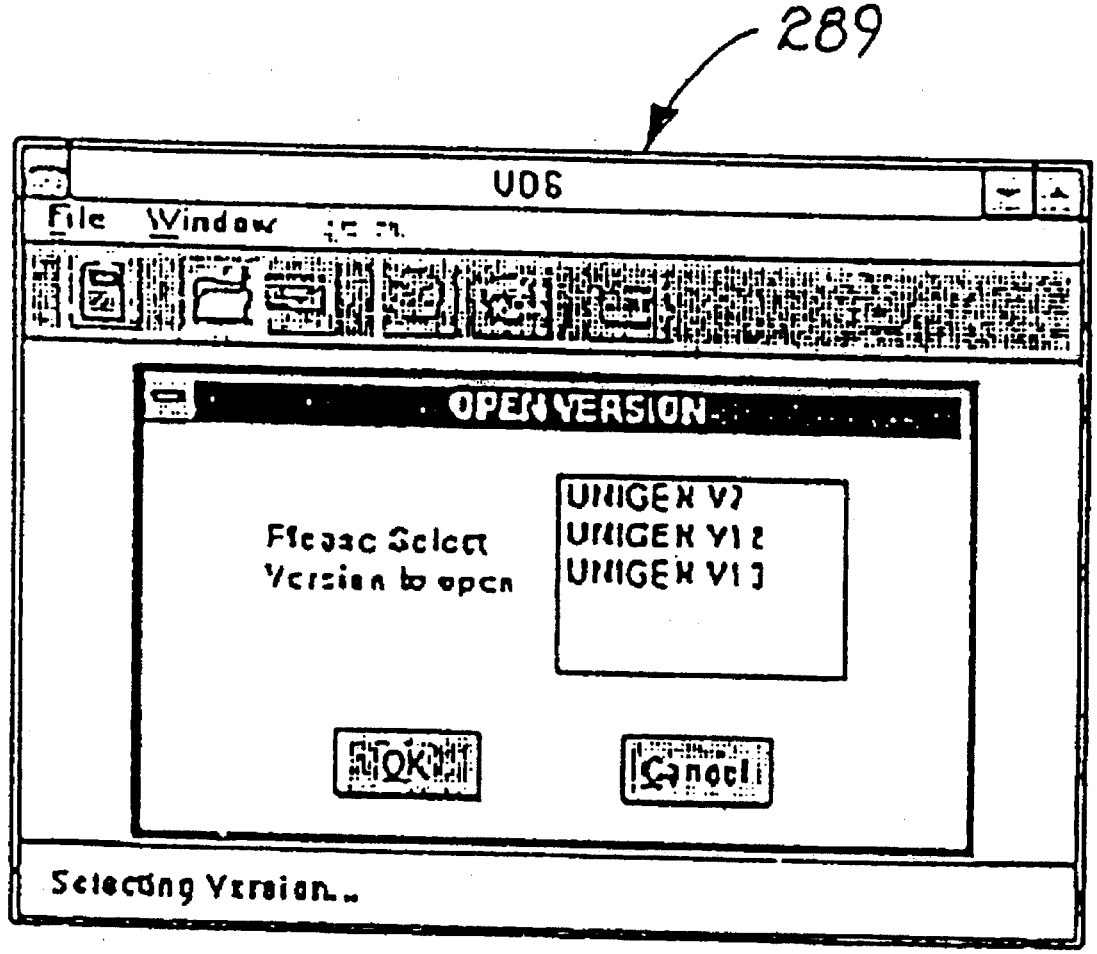
FIG. 31 is a pictorial illustration of a version display box screen display of the system diagnostic application of the present invention.
Figure 32:
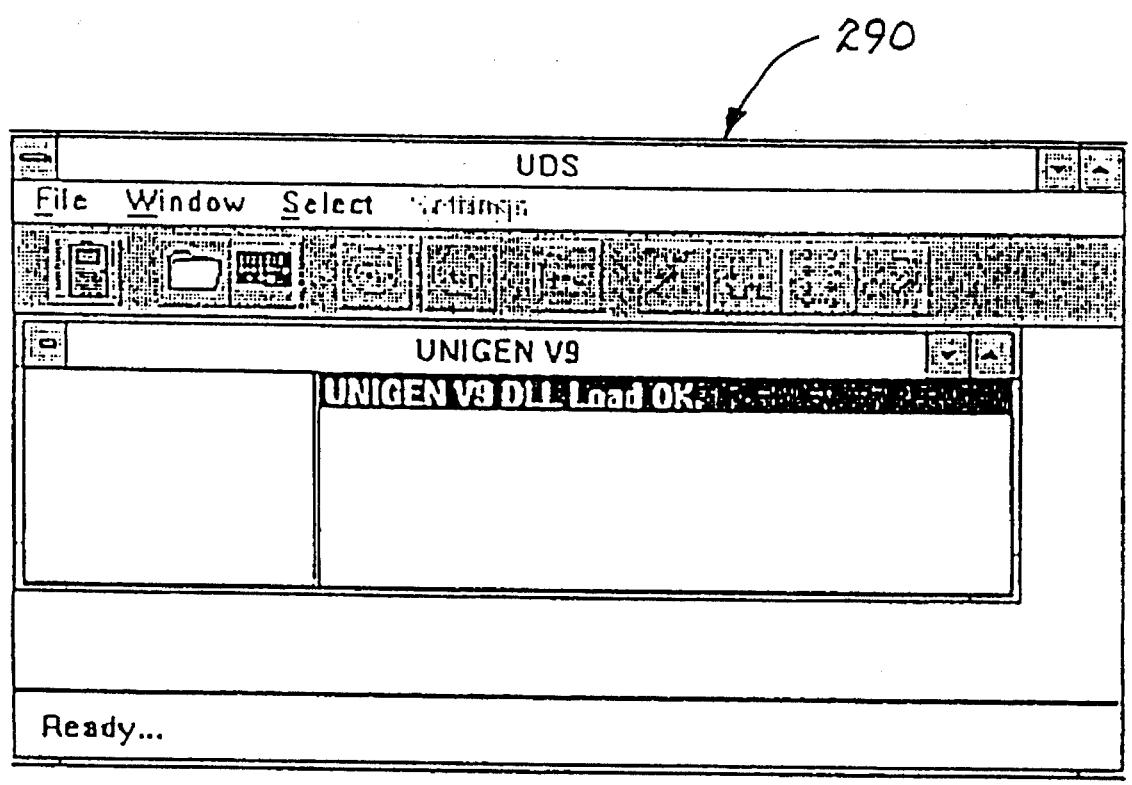
FIG. 32 is a pictorial illustration of a status window screen display of the system diagnostic application of the present invention.
Figure 33:
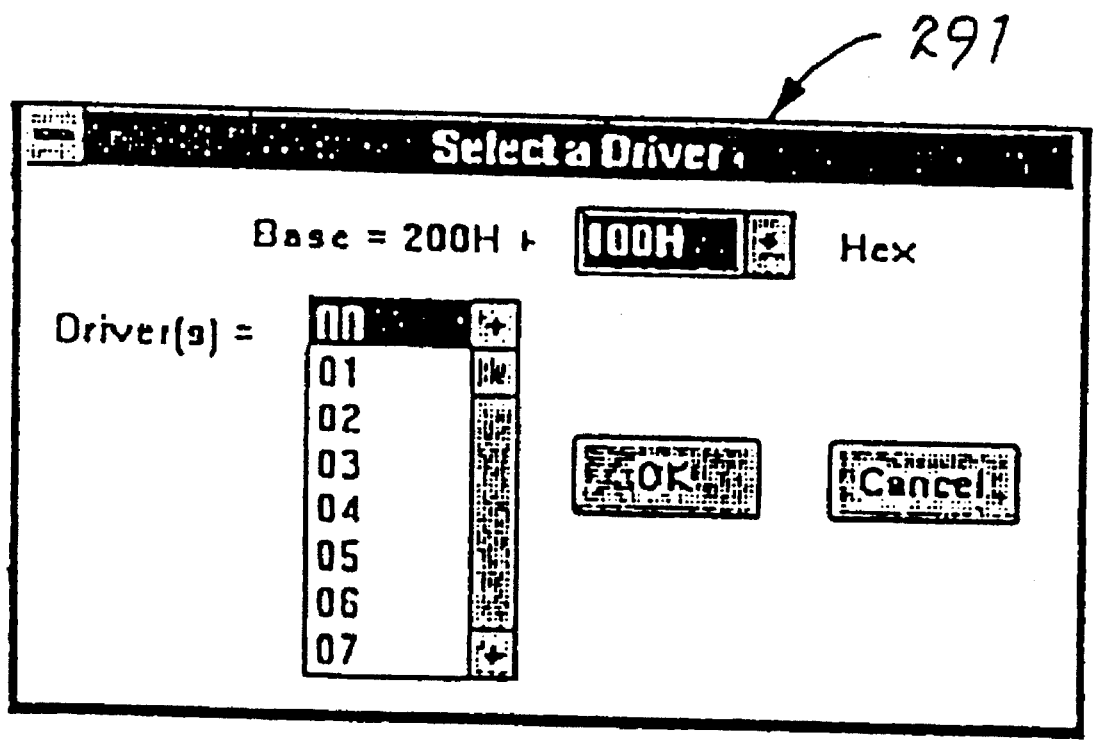
FIG. 33 is a pictorial illustration of a Select a Driver screen display of the system diagnostic application of the present invention.
Figure 34:
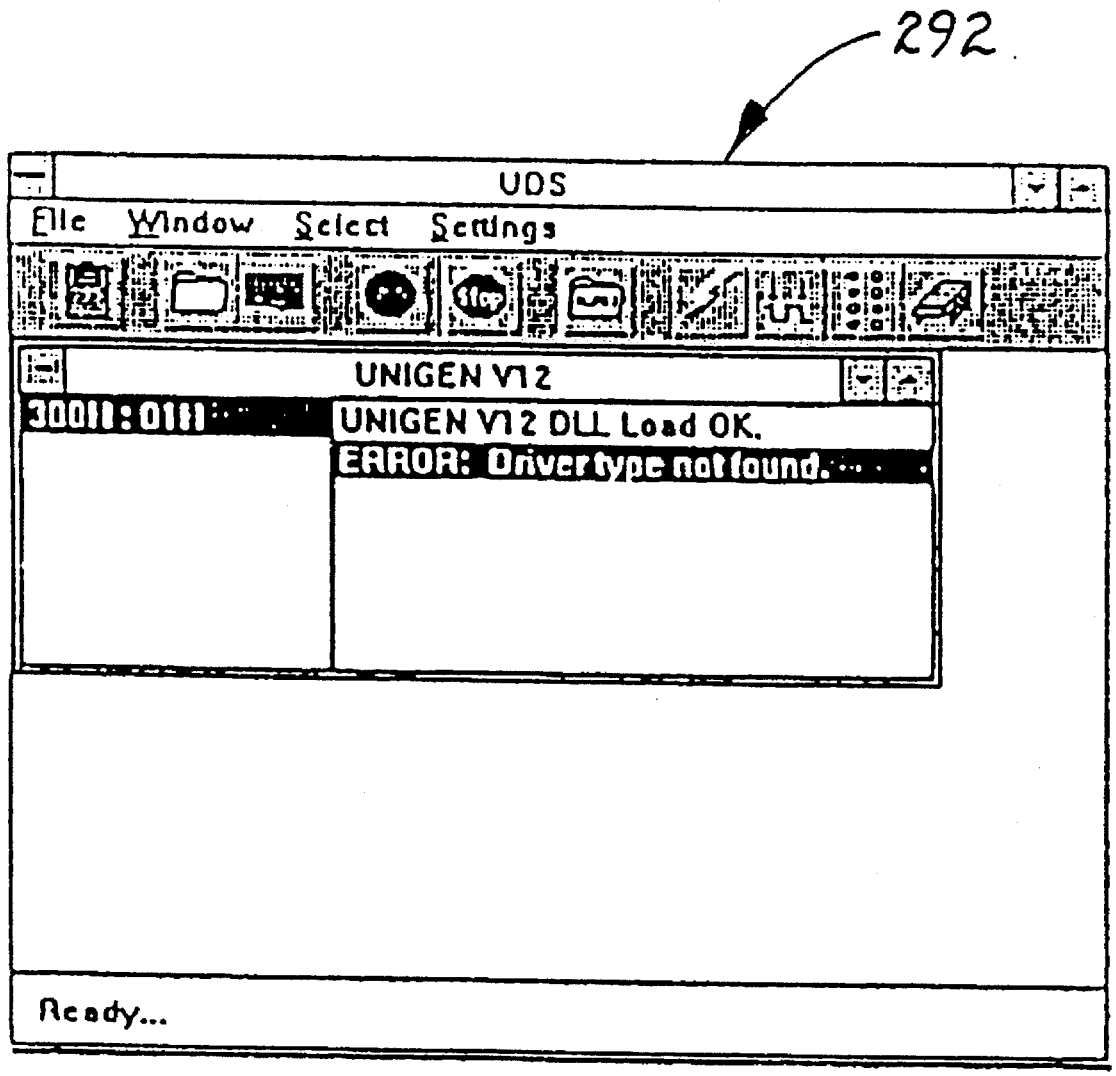
FIG. 34 is a pictorial illustration of an Information about Driver screen display of the system diagnostic application of the present invention.
Figure 35:
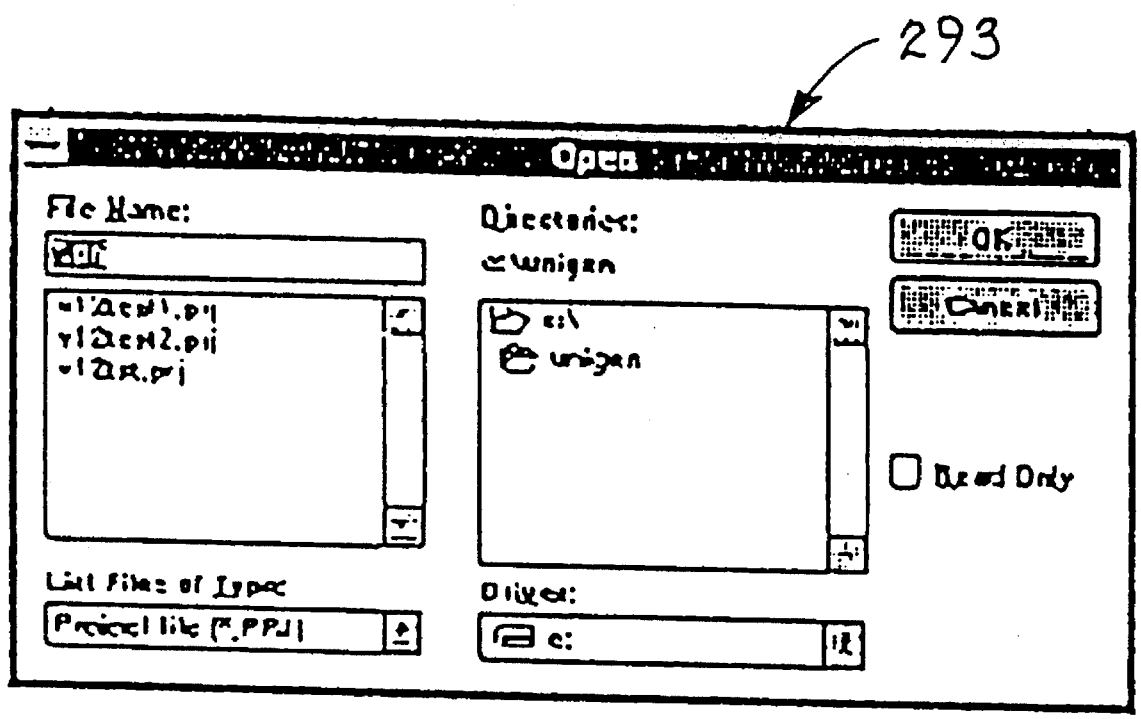
FIG. 35 is a pictorial illustration of a file selection box screen display of the system diagnostic application of the present invention.
Figure 36:
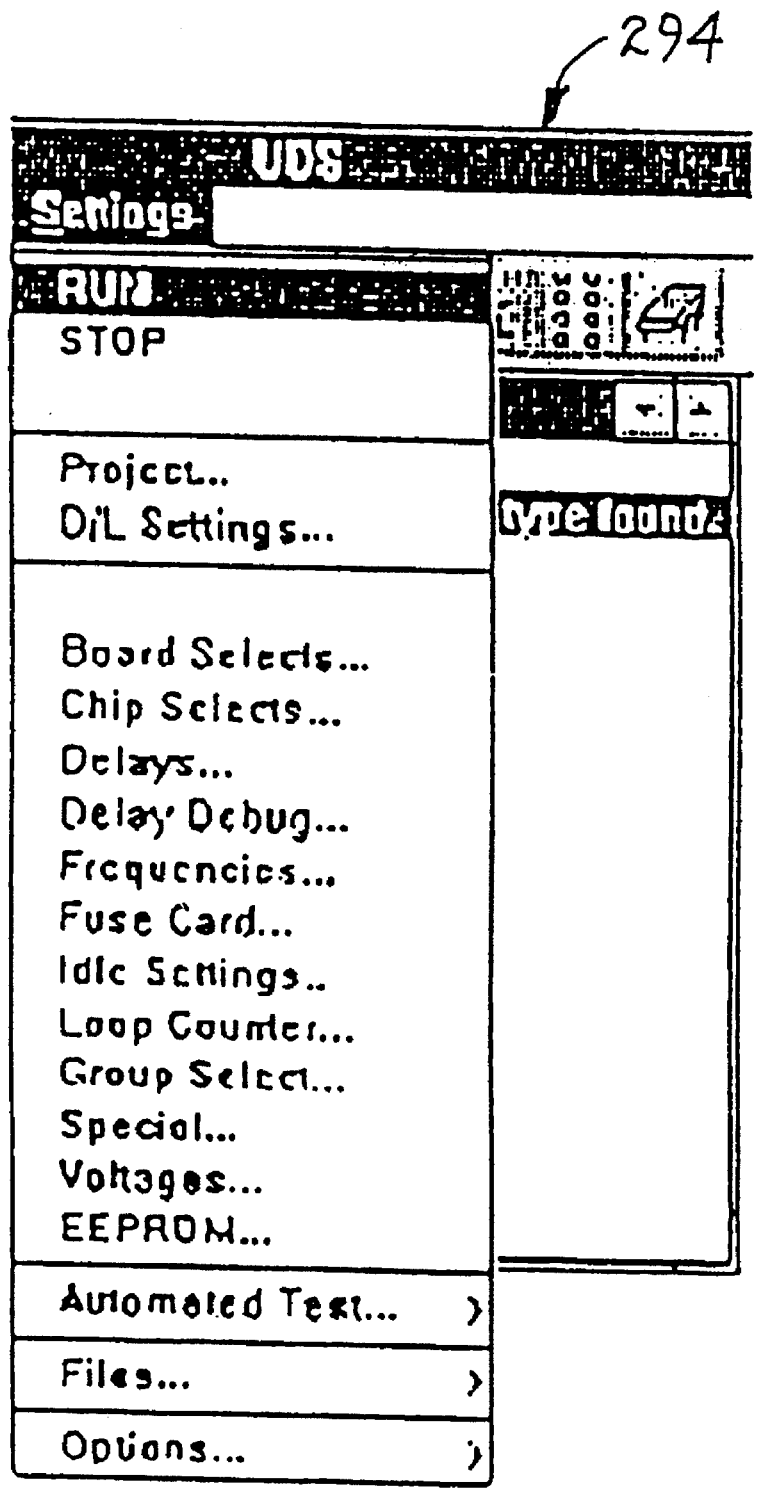
FIG. 36 is a pictorial illustration of a settings menu screen display of the system diagnostic application of the present invention.

The user may operate the UDS 203, for example, as follows. The user may click the UDS icon twice with the mouse pointer to open the application. The initial UDS Screen 288 (see FIG. 30) will appear. The user may then click the File menu in the upper right hand corner, or the file icon, once to open a specific file. The Version Display Dialog Box (see FIG. 31) will appear. The user may then click "Open Version", choose the desired version, and click OK. When the selection is complete, the UDS 203 automatically opens all information programs associated with the selected driver. The Status Window Screen 290 (see FIG. 32) will appear. Click on the new button to select a driver. The Select a Driver Screen 291 (see FIG. 33) will appear. The user may then select the appropriate address (e.g., 300 hex and driver number) from the screen. (Note that the I\O card address is hexadecimal and generally stays the same and is referred to as the based address. However, the address might often change depending on which driver is accessed.) The user may then click OK. If the driver is present, or an error occurs, it will be displayed in the status window. The Information about a Driver Screen 292 (see FIG. 34) is displayed. The user may then download a project by either clicking on the project button or applying the settings menu. This action displays a File Selection Box 293, (see FIG. 35). The user may then choose the appropriate file and click OK. The status window opens when the driver address is selected. A message will appear if the communication to hardware is successful or if there is an error occurring. The user may then click on the GO button to start the test defined by the project that has been downloaded to driver 100. The user can change various parameters during testing by use of the settings pull down menu 294 (see FIG. 36). When testing is complete, the user may click the STOP button. The user may exit the UDS 203 by either clicking on the exit button or by using the File menu.

The system software of the present invention contains its own installation utility. The setup program is a standard Microsoft@ Windows@ based setup utility with customized features. Backup, for instance, allows a user that already has the system software to save the old version and install a new copy. The setup screen prompts the current user for their name and company name. After completing the installation procedure, the Windows@ Program Manager creates a group containing the icons needed for the present applications. As an example of installation, the user, to install the software for Windows on the computer hard drive, performs the following steps: (1) Start Windows@; (2) Insert the first Setup and Applications disk into the floppy drive of the computer; (3) In Windows@ Program Manager, choose File Run; (4) A dialog box will prompt for the name of the file to run; (5) If installing from a floppy drive a:, type a:\setup.exe.; (6) Press ENTER and a dialog box appears after initializing the setup program and prompting filling out the product registration box; (7) Follow the instructions on the screen to prompt the user to enter the path wanted for installation of the system software; (8) A dialog box will appear on the screen if multiple versions of the software will be overwritten. It will create a \BACKUP directory in the destination path to back up files selected. The user may skip this step if the destination path is empty; (9) When the setup procedure is complete, a dialog box will appear, and the software is ready for use.

The following information is basic procedure for installing the software key of the security system.

1. Find the LPT1 port on the back of the machine called.
2. Plug the software key into the port.
3. Plug the printer into software key if necessary.

What is claimed is:

1. In association with a burn-in system of the type comprising test vector storage means for storing data patterns defining the sequence of electrical signals for a burn-in operation to be applied to devices under test; burn-in driver means for controlling the magnitude and frequency content of said electrical signal for burn-in of said devices under test, said burn-in driver means further comprising means for identifying said devices under test; and computer means coupled to said test vector storage means and coupled to said burn-in driver means for changing said sequence, said magnitude and said frequency under program control in response to said means for identifying said devices under test to dynamically modify said sequence of electrical signals for burn-in of said devices under test, a computer system comprising, in combination:

a. first computer editing means for independently setting vector parameters as vector data for testing a said device under test; and b. computer data storage means for storing said vector data as an identified project file.

2. A computer system according to claim 1 wherein said first computer editing means includes display means for graphic representation of test waveforms for multiple channels.

3. A computer system according to claim 1 wherein said vector data is storable in said computer data storage means in form for use to configure said burn-in driver means.

4. A computer system according to claim 1 including:

a. second computer editing means for independently setting sequential parameters as sequence data for controlling the testing of semiconductor devices; and b. computer data storage means for storing said sequence data as an identified sequence file.

5. A computer system according to claim 4 wherein said second computer editing means includes command means for including said identified project file as one of said sequential parameters.

6. A computer system according to claim 4 wherein said sequence data is storable in said computer data storage means in form for use to control said burn-in driver means.

7. A computer system according to claim 4 including:

a. third computer editing means for graphically setting as burn-in system data a burn-in system configuration for controlling the testing of said devices under test; and b. computer data storage means for storing said burn-in system data as an identified burn-in system file.

8. A computer system according to claim 7 including computer burn-in control means for controlling said burn-in system.

9. A computer system according to claim 8 wherein said computer burn-in control means includes command means for including said identified burn-in system file as said burn-in system data.

10. A computer system according to claim 8 wherein said computer burn-in control means includes command means for including said identified sequence file for use to control said burn-in driver means.

11. A computer system according to claim 8 wherein said computer burn-in control means includes reactive means for mid-test amendment of sequence parameters in response to computer receipt from said driver means of selected test data concerning said device under test.

12. A computer system according to claim 8 including computer diagnostic means for testing said burn-in system.

13. A computer system according to claim 12 wherein said computer system contains a data port and including computer security means for restricting access to said computer system, said security means including the requirement for access of the presence of a pluggable key in said data port of said computer system.

14. A computer system according to claim 7 wherein said first, second, and third computer editing means include menu-based, interactive, graphic displays.

15. A computer system according to claim 1 including computer diagnostic means for testing said burn-in system.

16. A computer system according to claim 15 wherein said computer diagnostic means includes command means for using said identified project file to reconfigure said driver means.

17. A computer system according to claim 1 wherein said computer system contains a data port and including computer security means for restricting access to said computer system, said security means including the requirement for access of the presence of a pluggable key in said data port of said computer system.

18. The method for making a computer-control system for a burn-in system of the type comprising test vector storage means for storing data patterns defining the sequence of electrical signals for a burn-in operation to be applied to devices under test; burn-in driver means for controlling the magnitude and frequency content of said electrical signal for burn-in of said devices under test, said burn-in driver means further comprising means for identifying said devices under test; and computer means coupled to said test vector storage means and coupled to said burn-in driver means for changing said sequence, said magnitude and said frequency under program control in response to said means for identifying said devices under test to dynamically modify said sequence of electrical signals for burn-in of said devices under test, comprising the steps of:

a. providing first computer editing means for independently setting vector parameters as vector data for testing a said device under test; and b. providing computer data storage means for storing said vector data as an identified project file.

19. The method for making a computer-control system according to claim 18 further comprising the step of providing that said first computer editing means includes display means for graphic representation of test waveforms for multiple channels.

20. The method for making a computer-control system according to claim 18 further comprising the step of providing that said vector data is storable in said computer data storage means in form for use to configure said burn-in driver means.

21. The method for making a computer-control system according to claim 18 further comprising the steps of:

a. providing second computer editing means for independently setting sequential parameters as sequence data for controlling the testing of semiconductor devices; and b. providing computer data storage means for storing said sequence data as an identified sequence file.

22. The method for making a computer-control system according to claim 21 further comprising the step of providing that said second computer editing means includes command means for including said identified project file as one of said sequential parameters.

23. The method for making a computer-control system according to claim 21 further comprising the step of providing that said sequence data is storable in said computer data storage means in form for use to control said burn-in driver means.

24. The method for making a computer-control system according to claim 21 further comprising the steps of:

a. providing third computer editing means for graphically setting as burn-in system data a burn-in system configuration for controlling the testing of said devices under test; and b. providing computer data storage means for storing said burn-in system data as an identified burn-in system file.

25. The method for making a computer-control system according to claim 24 further comprising the step of providing computer burn-in control means for controlling said burn-in system.

26. The method for making a computer-control system according to claim 25 further comprising the step of providing that said computer burn-in control means includes command means for including said identified burn-in system file as said burn-in system data.

27. The method for making a computer-control system according to claim 25 further comprising the step of providing that said computer burn-in control means includes command means for including said identified sequence file for use to control said burn-in driver means.

28. The method for making a computer-control system according to claim 25 further comprising the step of providing that said computer burn-in control means includes reactive means for mid-test amendment of sequence parameters in response to computer receipt from said driver means of selected test data concerning said device under test.

29. The method for making a computer-control system according to claim 25 further comprising the step of providing computer diagnostic means for testing said burn-in system.

30. The method for making a computer-control system according to claim 29 further comprising the steps of:
  a. providing that said computer system contains a data port; and
  b. providing computer security means for restricting access to said computer system, said security means including the requirement for access of the presence of a pluggable key in said data port of said computer system.

31. The method for making a computer-control system according to claim 25 further comprising the step of providing that said computer diagnostic means includes command means for using said identified project file to reconfigure said driver means.

32. The method for making a computer-control system according to claim 24 further comprising the step of providing that said first, second, and third computer editing means include menu-based, interactive, graphic displays.

33. The method for making a computer-control system according to claim 18 further comprising the steps of:
  a. providing that said computer system contains a data port; and
  b. providing computer security means for restricting access to said computer system, said security means including the requirement for access of the presence of a pluggable key in said data port of said computer system.

34. The method for computer control of a burn-in system of the type comprising test vector computer data storage means for storing data patterns defining the sequence of electrical signals for a burn-in operation to be applied to devices under test; burn-in driver means for controlling the magnitude and frequency content of said electrical signal for burn-in of said devices under test, said burn-in driver means further comprising means for identifying said devices under test; and computer means coupled to said test vector storage means and coupled to said burn-in driver means for changing said sequence, said magnitude and said frequency under program control in response to said means for identifying said devices under test to dynamically modify said sequence of electrical signals for burn-in of said devices under test, comprising the steps of:

a. by said computer means, independently setting vector parameters as vector data for testing a said device under test; and
  b. by said computer means, storing in said computer data storage means said vector data as an identified project file.

35. The method for computer control according to claim 34 further comprising the step of displaying, by said computer means, graphic representation of test waveforms for multiple channels during said setting of said vector parameters.

36. The method for computer control according to claim 34 further comprising the step of storing said vector data in said computer data storage means in form for use to configure said burn-in driver means.

37. The method for computer control according to claim 34 further comprising the steps of:
  a. independently setting, by said computer means sequential parameters as sequence data for controlling the testing of said device under test; and
  b. by said computer means, storing in said computer data storage means said sequence data as an identified sequence file.

38. The method for computer control according to claim 37 further comprising the step of including said identified project file as at least one of said sequential parameters.

39. The method for computer control according to claim 37 further comprising the step of storing said sequence data in said computer data storage means in form for use to control said burn-in driver means.

40. The method for computer control according to claim 37 further comprising the steps of:
  a. by said computer means, graphically setting as burn-in system data a burn-in system configuration for controlling the testing of device under test; and
  b. by said computer means, storing said burn-in system data as an identified burn-in system file.

41. The method for computer-control system according to claim 40 further comprising the step of controlling by said computer means, said burn-in system.

42. The method for computer control according to claim 41 further comprising the step of including said identified burn-in system file in said controlling by said computer means.

43. The method for computer-control according to claim 41 further comprising the step of including said identified sequence file in said controlling by said computer means.

44. The method for computer control according to claim 41 further comprising the step of mid-test amending of sequence parameters in response to computer receipt from said driver means of selected test data concerning said device under test.

45. The method for computer control according to claim 41 further the step of testing, by said computer means, said burn-in system.

46. The method for computer control according to claim 45 further comprising the step of using said identified project file to reconfigure said driver means.

47. The method for computer control according to claim 45 further comprising the steps of:
  a. including a data port in said computer means; and
  b. restricting access to said computer means by security means, said security means including the requirement for access of the presence of a pluggable key in said data port of said computer means.

48. The method for computer control according to claim 40 further comprising the step of using menu-based, interactive, graphic displays.

49. The method for computer control according to claim 34 further comprising the steps of:

a. including a data port in said computer means; and
b. restricting access to said computer means by security means, said security means including the requirement for access of the presence of a pluggable key in said data port of said computer means.

50. In association with a burn-in system of the type comprising test vector storage means for storing data patterns defining the sequence of electrical signals for a burn-in operation to be applied to devices under test; burn-in driver means for controlling the magnitude and frequency content of said electrical signal for burn-in of said devices under test, said burn-in driver means further comprising means for identifying said devices under test; and computer means coupled to said test vector storage means and coupled to said burn-in driver means for changing said sequence, said magnitude and said frequency under program control in response to said means for identifying said devices under test to dynamically modify said sequence of electrical signals for burn-in of said devices under test, a computer system comprising, in combination:

a. first computer editing means for independently setting vector parameters as vector data for testing a said device under test
   i. wherein said first computer editing means includes display means for graphic representation of test waveforms for multiple channels;
b. computer data storage means for storing said vector data as an identified project file
   i. wherein said vector data is storable in said computer data storage means in form for use to configure said burn-in driver means;
c. second computer editing means for independently setting sequential parameters as sequence data for controlling the testing of said devices under test
   i. wherein said second computer editing means includes command means for including as one of said sequential parameters said identified project file;
d. computer data storage means for storing said sequence data as an identified sequence file
   i. wherein said sequence data is storable in said computer data storage means in form for use to control said burn-in driver means;
e. third computer editing means for graphically setting as burn-in system data a burn-in system configuration for controlling the testing of said devices under test;
f. computer data storage means for storing said burn-in system data as an identified burn-in system file;
g. computer burn-in control means for controlling said burn-in system
   i. wherein said computer burn-in control means includes command means for including said identified burn-in system file as said burn-in system data,
   ii. wherein said computer burn-in control means includes command means for including said identified sequence file for use to control said burn-in driver means, and
   iii. wherein said computer burn-in control means includes reactive means for mid-test amendment of sequence parameters in response to computer receipt from said driver means of selected test data concerning said device under test;
h. computer diagnostic means for testing said burn-in system
   i. wherein said computer diagnostic means includes command means for using said identified project file to reconfigure said driver means; and
i. wherein said first, second, and third computer editing means include menu-based, interactive, graphic displays.

51. A computer system according to claim 50 wherein said computer system contains a data port and including computer security means for restricting access to said computer system, said security means including the requirement for access of the presence of a pluggable key in said data port of said computer system.

52. The method for making a computer-control system for a burn-in system of the type comprising test vector storage means for storing data patterns defining the sequence of electrical signals for a burn-in operation to be applied to devices under test; burn-in driver means for controlling the magnitude and frequency content of said electrical signal for burn-in of said devices under test, said burn-in driver means further comprising means for identifying said devices under test; and computer means coupled to said test vector storage means and coupled to said burn-in driver means for changing said sequence, said magnitude and said frequency under program control in response to said means for identifying said devices under test to dynamically modify said sequence of electrical signals for burn-in of said devices under test, comprising the steps of:

a. providing first computer editing means for independently setting vector parameters as vector data for testing a said device under test;
b. providing that said first computer editing means includes display means for graphic representation of test waveforms for multiple channels;
c. providing computer data storage means for storing said vector data as an identified project file;
d. providing that said vector data is storable in said computer data storage means in form for use to configure said burn-in driver means;
e. providing second computer editing means for independently setting sequential parameters as sequence data for controlling the testing of said devices under test;
f. providing that said second computer editing means includes command means for including as one of said sequential parameters said identified project file;
g. providing computer data storage means for storing said sequence data as an identified sequence file;
h. providing that said sequence data is storable in said computer data storage means in form for use to control said burn-in driver means;
i. providing third computer editing means for graphically setting as burn-in system data a burn-in system configuration for controlling the testing of said devices under test;
j. providing computer data storage means for storing said burn-in system data as an identified burn-in system file;
k. providing computer burn-in control means for controlling said burn-in system;
l. providing that said computer burn-in control means includes command means for including said identified burn-in system file as burn-in system data;
m. providing that said computer burn-in control means includes command means for including a said identified sequence file for use to control said burn-in driver means;
n. providing that said computer burn-in control means includes reactive means for mid-test amendment of sequence parameters in response to computer receipt from said driver means of selected test data concerning said device under test;

o. providing computer diagnostic means for testing said burn-in system;

p. providing that said computer diagnostic means includes command means for using a said identified project file to reconfigure said driver means; and q. providing that said first, second, and third computer editing means include menu-based, interactive, graphic displays.

53. The method for making a computer-control system according to claim 52 further comprising the steps of:

a. providing that said computer system contains a data port; and b. providing computer security means for restricting access to said computer system, said security means including the requirement for access of the presence of a pluggable key in said data port of said computer system.

54. The method for computer control of a burn-in system of the type comprising test vector computer data storage means for storing data patterns defining the sequence of electrical signals for a burn-in operation to be applied to devices under test; burn-in driver means for controlling the magnitude and frequency content of said electrical signal for burn-in of said devices under test, said burn-in driver means further comprising means for identifying said devices under test; and computer means coupled to said test vector storage means and coupled to said burn-in driver means for changing said sequence, said magnitude and said frequency under program control in response to said means for identifying said devices under test to dynamically modify said sequence of electrical signals for burn-in of said devices under test, comprising the steps of:

a. by said computer means, independently setting vector parameters as vector data for testing a said device under test;

b. by said computer means, displaying graphic representation of test waveforms for multiple channels during said setting, by said computer means, of said vector parameters;

c. by said computer means, storing in said computer data storage means said vector data as an identified project file;

d. storing said vector data in said computer data storage means in form for use to configure said burn-in driver means;

e. by said computer means, independently setting sequential parameters as sequence data for controlling the testing of said devices under test;

f. including as at least one of said sequential parameters said identified project file;

g. by said computer means, storing in said computer data storage means said sequence data as an identified sequence file;

h. storing said sequence data in said computer data storage means in form for use to control said burn-in driver means;

i. by said computer means, graphically setting as burn-in system data a burn-in system configuration for controlling the testing of said devices under test;

j. by said computer means, storing in said computer data storage means said burn-in system data as an identified burn-in system file;

k. by said computer means, controlling said burn-in system;

l. including said identified burn-in system file in said controlling of said burn-in system;

m. including said identified sequence file in said controlling of said burn-in system;

n. mid-test amending of said sequential parameters in response to computer receipt from said driver means of selected test data concerning said device under test;

o. by said computer means, testing said burn-in system including said driver means;

p. in said testing, using said identified project file to reconfigure said driver means; and q. including menu-based, interactive, graphic displays.

55. The method for computer control according to claim 54 further comprising the steps of:

a. including a data port in said computer system; and b. restricting access to said computer system by security means, said security means including the requirement for access of the presence of a pluggable key in said data port of said computer system.

56. In association with a burn-in system of the type comprising test vector computer data storage means for storing data patterns defining the sequence of electrical signals for a burn-in operation to be applied to devices under test; burn-in driver means for controlling the magnitude and frequency content of said electrical signal for burn-in of said devices under test, said burn-in driver means further comprising means for identifying said devices under test; and computer means coupled to said test vector storage means and coupled to said burn-in driver means for changing said sequence, said magnitude and said frequency under program control in response to said means for identifying said devices under test to dynamically modify said sequence of electrical signals for burn-in of said devices under test, a computer system comprising, in combination:

a. computer editing means for independently setting, as vector data, first vector parameters for testing a first said device under test and second vector parameters for testing a second said device under test;

b. said computer data storage means for storing, as vector data, said first vector parameters as an identified first project file and said second vector parameters as an identified second project file
   i. wherein said vector data is storable in said computer data storage means in form for use to configure said burn-in driver means; and c. computer burn-in control means for controlling said burn-in system
   i. wherein said computer burn-in control means includes command means for including said identified first project file and said identified second project file as vector parameters for use to control said burn-in driver means for testing during the same time period of both said first device under test and said second device under test.

57. In association with a burn-in system of the type comprising test vector computer data storage means for storing data patterns defining the sequence of electrical signals for a burn-in operation to be applied to devices under test; burn-in driver means for controlling the magnitude and frequency content of said electrical signal for burn-in of said devices under test, said burn-in driver means further comprising means for identifying said devices under test; and computer means coupled to said test vector storage means and coupled to said burn-in driver means for changing said sequence, said magnitude and said frequency under program control in response to said means for identifying said devices under test to dynamically modify said sequence of electrical signals for burn-in of said devices under test, a computer system comprising, in combination:

a. first computer editing means for independently setting, as vector data, first vector parameters for testing a first said device under test and second vector parameters for testing a second said device under test
   i. wherein said first computer editing means includes display means for graphic representation of test waveforms for multiple channels;

b. said computer data storage means for storing, as vector data, said first vector parameters as an identified first project file and said second vector parameters as an identified second project file
   i. wherein said vector data is storable in said computer data storage means in form for use to configure said burn-in driver means;

c. second computer editing means for independently setting, as sequence data, first sequential parameters for controlling the testing of said first device under test and second sequential parameters for controlling the testing of said second device under test
   i. wherein said second computer editing means includes command means for including as one of said first sequential parameters said first identified project file and including as one of said second sequential parameters said second identified project file;

d. said computer data storage means for storing, as sequence data, said first sequential parameters as an identified first sequence file associated with said first device under test and said second sequential parameters as an identified second sequence file associated with said second device under test
   i. wherein said sequence data is storable in said computer data storage means in form for use to control said burn-in driver means;

e. third computer editing means for graphically setting, as burn-in system data, a burn-in system configuration for controlling the testing of said first device under test and said second device under test;

f. said computer data storage means for storing said burn-in system data as an identified burn-in system file;

g. computer burn-in control means for controlling said burn-in system
   i. wherein said computer burn-in control means includes command means for including said identified burn-in system file as burn-in system data, and
   ii. wherein said computer burn-in control means includes command means for including said first sequence file and said second sequence file for use to control said burn-in driver means for testing during the same time period of both said first device under test and said second device under test; and h. wherein said first, second, and third computer editing means include menu-based, interactive, graphic displays.

58. The method for making a computer-control system for a burn-in system of the type comprising test vector storage means for storing data patterns defining the sequence of electrical signals for a burn-in operation to be applied to devices under test; burn-in driver means for controlling the magnitude and frequency content of said electrical signal for burn-in of said devices under test, said burn-in driver means further comprising means for identifying said devices under test; and computer means coupled to said test vector storage means and coupled to said burn-in driver means for changing said sequence, said magnitude and said frequency under program control in response to said means for identifying said devices under test to dynamically modify said sequence of electrical signals for burn-in of said devices under test, comprising the steps of:

a. providing computer editing means for independently setting, as vector data, first vector parameters for testing a first said device under test and second vector parameters for testing a second said device under test;

b. providing computer data storage means for storing, as vector data, said first vector parameters as an identified first project file and said second vector parameters as an identified second project file
   i. wherein said vector data is storable in said computer data storage means in form for use to configure said burn-in driver means; and c. providing computer burn-in control means for controlling said burn-in system
   i. wherein said computer burn-in control means includes command means for including said first identified project file and said second identified project file for use to control said burn-in driver means for testing during the same time period of both said first device under test and said second device under test.

59. The method for computer control of a burn-in system of the type comprising test vector computer data storage means for storing data patterns defining the sequence of electrical signals for a burn-in operation to be applied to devices under test; burn-in driver means for controlling the magnitude and frequency content of said electrical signal for burn-in of said devices under test, said burn-in driver means further comprising means for identifying said devices under test; and computer means coupled to said test vector storage means and coupled to said burn-in driver means for changing said sequence, said magnitude and said frequency under program control in response to said means for identifying said devices under test to dynamically modify said sequence of electrical signals for burn-in of said devices under test, comprising the steps of:

a. by said computer means, independently setting first vector parameters as vector data for testing a first said device under test;

b. by said computer means, storing in said computer data storage means, as vector data, said first vector parameters as an identified first project file;

c. by said computer means, independently setting second vector parameters as vector data for testing a second said device under test;

d. by said computer means, storing in said computer data storage means, as vector data, said second vector parameters as an identified second project file;

e. by said computer means, storing said vector data in said computer data storage means in form for use to configure said burn-in driver means;

f. by said computer means, controlling said burn-in system for testing during the same time period of both said first device under test and said second device under test;

g. including in said controlling of said burn-in system said first identified project file and said second identified project file for use to control said burn-in driver means for testing during the same time period of both said first device under test and said second device under test.

60. The method for computer control of a burn-in system of the type comprising test vector computer data storage means for storing data patterns defining the sequence of electrical signals for a burn-in operation to be applied to devices under test; burn-in driver means for controlling the magnitude and frequency content of said electrical signal for burn-in of said devices under test, said burn-in driver means further comprising means for identifying said devices under test; and computer means coupled to said test vector storage means and coupled to said burn-in driver means for changing said sequence, said magnitude and said frequency under program control in response to said means for identifying said devices under test to dynamically modify said sequence of electrical signals for burn-in of said devices under test, comprising the steps of:

a. by said computer means, independently setting first vector parameters as vector data for testing a first said device under test;

b. by said computer means, storing in said computer data storage means, as vector data, said first vector parameters as an identified first project file;

c. by said computer means, independently setting second vector parameters as vector data for testing a second said device under test;

d. by said computer means, storing in said computer data storage means, as vector data, said second vector parameters as an identified second project file;

e. by said computer means, displaying graphic representation of test waveforms for multiple channels during said setting of said vector parameters;

f. by said computer means, storing said vector data in said computer data storage means in form for use to configure said burn-in driver means;

g. by said computer means, independently setting, as sequence data, first sequential parameters for controlling the testing of said first device under test;

h. including as one of said first sequential parameters said first identified project file;

i. by means of said computer, storing in said computer data storage means, as sequence data, said first sequential parameters as an identified first sequence file associated with said first device under test
  i. wherein said sequence data is stored in form for use to control said burn-in driver means;

j. by said computer means, independently setting, as sequence data, second sequential parameters for controlling the testing of said second device under test;

k. including as one of said second sequential parameters said second identified project file;

l. by said computer means, storing in said computer data storage means, as sequence data, said second sequential parameters as an identified second sequence file associated with said second device under test
  i. wherein said sequence data is stored in form for use to control said burn-in driver means;

m. by means of said computer, graphically setting as burn-in system data a burn-in system configuration for controlling the testing of said first device under test and said second device under test;

n. by means of said computer, storing in said computer data storage means said burn-in system data as an identified burn-in system file;

o. by means of said computer, controlling said burn-in system for testing during the same time period of both said first device under test and said second device under test;

p. including in said controlling of said burn-in system said identified burn-in system file;

q. including in said controlling of said burn-in system said first identified sequence file and said second identified sequence file for use to control said burn-in driver means for testing during the same time period of both said first device under test and said second device under test; and r. including menu-based, interactive, graphic displays.

* * * * *